(12) United States Patent
Kim et al.

(10) Patent No.: US 11,727,846 B2
(45) Date of Patent: Aug. 15, 2023

(54) LIGHT EMITTING DISPLAY APPARATUS

(71) Applicant: LG Display Co., Ltd., Seoul (KR)

(72) Inventors: Subin Kim, Paju-si (KR); Dongik Kim, Paju-si (KR); YoungIn Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/981,175

(22) Filed: Nov. 4, 2022

(65) Prior Publication Data

US 2023/0215315 A1 Jul. 6, 2023

(30) Foreign Application Priority Data

Dec. 31, 2021 (KR) ........................ 10-2021-0194754

(51) Int. Cl.
*G09G 3/20* (2006.01)

(52) U.S. Cl.
CPC ....... *G09G 3/20* (2013.01); *G09G 2310/0267* (2013.01); *G09G 2310/0286* (2013.01);
(Continued)

(58) Field of Classification Search
CPC ............. G09G 3/20; G09G 2310/0267; G09G 2310/0286; G09G 2310/0291; G09G 2310/08; G09G 2330/021
See application file for complete search history.

(56) References Cited

U.S. PATENT DOCUMENTS

| | | |
|---|---|---|
| 11,200,850 B2 | 1/2021 | Choi |
| 11,250,768 B2 | 2/2022 | Park et al. |
| | (Continued) | |

FOREIGN PATENT DOCUMENTS

| | | |
|---|---|---|
| EP | 3321920 A2 | 5/2018 |
| KR | 102211928 B | 2/2021 |
| | (Continued) | |

*Primary Examiner* — Sejoon Ahn
(74) *Attorney, Agent, or Firm* — Seed IP Law Group LLP

(57) ABSTRACT

A light emitting display apparatus includes a gate driver including stages provided in a substrate and a plurality of gate lines connected to the stages. Each of the stages includes a shift register and two buffers connected to the shift register, a first buffer of two buffers configuring an $n^{th}$ stage and a first shift register configuring the $n^{th}$ stage are provided in an $n^{th}$ horizontal portion and a second buffer of the two buffers is provided in an $n+2^{th}$ horizontal portion, a third buffer of two buffers configuring an $n+1^{th}$ stage and a second shift register configuring the $n+1^{th}$ stage are provided in an $n+3^{th}$ horizontal portion and a fourth buffer of the two buffers is provided in an $n+1^{th}$ horizontal portion, and the $n^{th}$ horizontal portion is a region including pixels which are arranged along a $4n-3^{th}$ gate line and a $4n-2^{th}$ gate line.

23 Claims, 14 Drawing Sheets

(52) U.S. Cl.
CPC . *G09G 2310/0291* (2013.01); *G09G 2310/08* (2013.01); *G09G 2330/021* (2013.01)

(56) References Cited

U.S. PATENT DOCUMENTS

| | | |
|---|---|---|
| 2016/0307517 A1 | 10/2016 | Park et al. |
| 2017/0345373 A1 | 11/2017 | Kang et al. |
| 2020/0394960 A1* | 12/2020 | Yuan .................... G09G 3/3266 |
| 2020/0394982 A1* | 12/2020 | Zhong .................... G09G 5/026 |

FOREIGN PATENT DOCUMENTS

| | | |
|---|---|---|
| KR | 20210086293 A | 7/2021 |
| KR | 20210086294 A | 7/2021 |

\* cited by examiner

US 11,727,846 B2

LIGHT EMITTING DISPLAY APPARATUS

CROSS-REFERENCE TO RELATED APPLICATIONS

This application claims the benefit of the Korean Patent Application No. 10-2021-0194754 filed on Dec. 31, 2021, which is hereby incorporated by reference as if fully set forth herein.

BACKGROUND

Technical Field

The present disclosure relates to a light emitting display apparatus.

Description of the Related Art

A gate driver may be directly provided in a non-display area of a light emitting display panel configuring a light emitting display apparatus, on the basis of a gate-in panel (GIP) type.

Recently, in order to realize a high resolution and increase the immersion of a user, a width of the non-display area has been progressively reduced, and light emitting display apparatuses including no non-display area have been proposed. However, there is a limitation in decreasing an area of transistors included in the gate driver.

Therefore, a light emitting display panel has been proposed where the transistors configuring the gate driver are provided in a display area. In this case, signal lines configuring the gate driver are arranged along a gate line.

However, as a resolution of a light emitting display panel increases, an area where the signal lines are provided is progressively reduced.

Therefore, a method for decreasing the number of signal lines provided along the gate line is needed.

BRIEF SUMMARY

Accordingly, the present disclosure is directed to providing a light emitting display apparatus that substantially obviates one or more problems due to limitations and disadvantages of the related art.

An aspect of the present disclosure is directed to providing a light emitting display apparatus in which a first stage is in a first horizontal position and a second stage is in a second horizontal position. Each stage has two buffers and each buffer drives two gate lines. One of the two buffers of the first stage drives the first two gate lines and the second of the two buffers in the first stage drives the fifth and sixth gates lines. The first buffer of the second stage drives the third and fourth gate lines and the second buffer of the second stage drives the seventh and eighth gate lines.

In one embodiment, the sequence of gate pulses being output to drive the respective gate lines is as follows: a first gate pulse output from the first stage onto the first gate line; and a second gate pulse output from the second onto the third gate line; a third gate pulse output from the first stage onto the second gate line; and a fourth gate pulse output from the second stage onto the fourth gate line.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

According to one embodiment, there is provided a light emitting display apparatus including a gate driver including stages provided in a substrate and a plurality of gate lines connected to the stages. Each of the stages includes a shift register and two buffers connected to the shift register, a $1\text{-}1^{th}$ buffer of two buffers configuring an $n^{th}$ stage and a first shift register configuring the $n^{th}$ stage are provided in an $n^{th}$ horizontal portion and a $1\text{-}2^{th}$ buffer of the two buffers is provided in an $n+2^{th}$ horizontal portion (where n is an odd number), a $2\text{-}2^{th}$ buffer of two buffers configuring an $n+1^{th}$ stage and a second shift register configuring the $n+1^{th}$ stage are provided in an $n+3^{th}$ horizontal portion and a $2\text{-}1^{th}$ buffer of the two buffers is provided in an $n+1^{th}$ horizontal portion, and the $n^{th}$ horizontal portion is a region including pixels which are arranged along a $4n-3^{th}$ gate line and a $4n-2^{th}$ gate line, the $n+1^{th}$ horizontal portion is a region including pixels which are arranged along a $4n-1^{th}$ gate line and a $4n^{th}$ gate line, the $n+2^{th}$ horizontal portion is a region including pixels which are arranged along a $4n+1^{th}$ gate line and a $4n+2^{th}$ gate line, and the $n+3^{th}$ horizontal portion is a region including pixels which are arranged along a $4n+3^{th}$ gate line and a $4n+4^{th}$ gate line.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
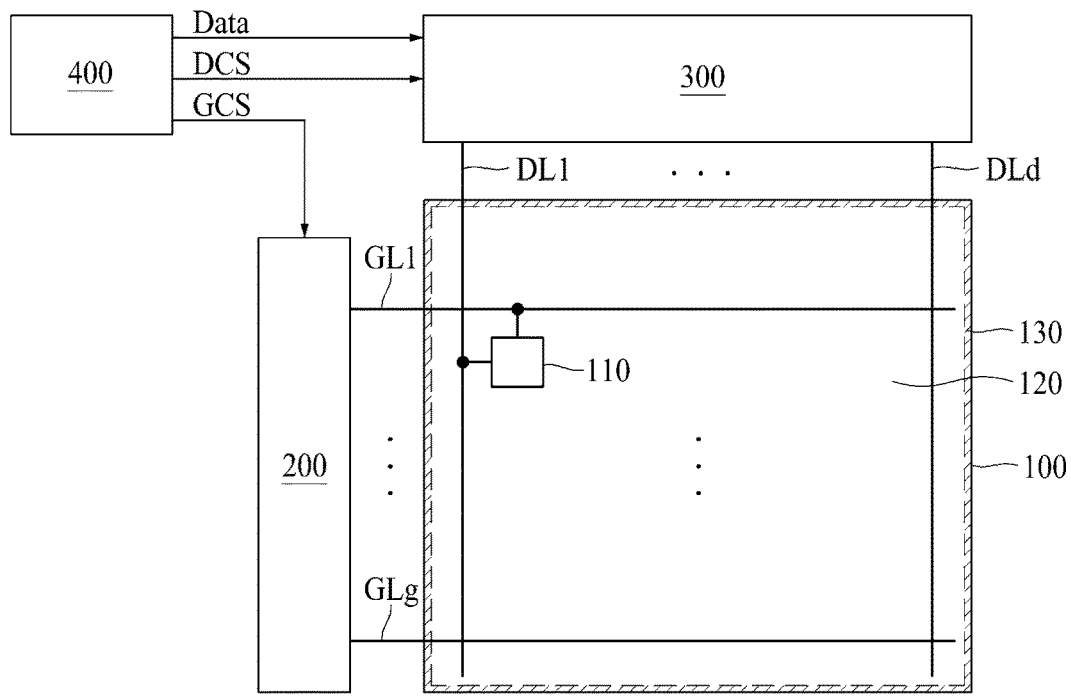
FIG. 1 is an exemplary diagram illustrating a configuration of a light emitting display apparatus according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc., may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Hereinafter, embodiments of the present disclosure will be described in detail with reference to the accompanying drawings.

Figure 2:
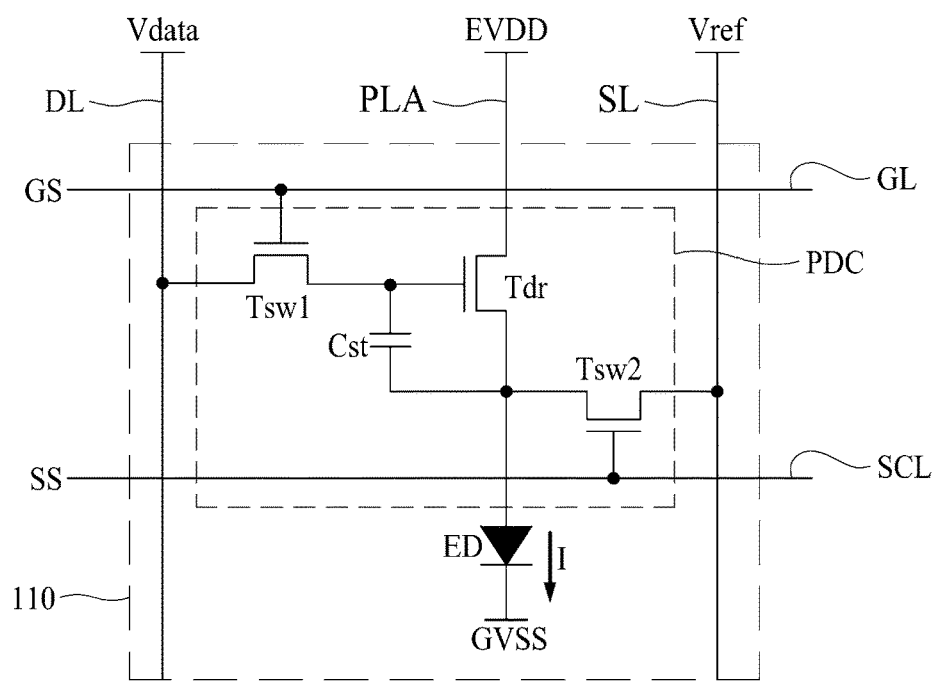
FIG. 2 is an exemplary diagram illustrating a structure of a pixel applied to a light emitting display apparatus according to the present disclosure.

FIG. 1 is an exemplary diagram illustrating a configuration of a light emitting display apparatus according to the present disclosure, and FIG. 2 is an exemplary diagram illustrating a structure of a pixel applied to a light emitting display apparatus according to the present disclosure.

The light emitting display apparatus according to the present disclosure may configure various electronic devices. The electronic devices may include, for example, smartphones, tablet personal computers (PCs), televisions (TVs), and monitors.

The light emitting display apparatus according to the present disclosure, as illustrated in FIG. 1, may include a light emitting display panel 100 which includes a display area 120 displaying an image and a non-display area 130 provided outside the display area 120, a gate driver 200 which supplies a gate signal to a plurality of gate lines GL1 to GLg provided in the display area 120 of the light emitting display panel 100, a data driver 300 which supplies data voltages to a plurality of data lines DL1 to DLd provided in the light emitting display panel 100, a controller 400 which controls driving of the gate driver 200 and the data driver 300, and a power supply which supplies power to the controller, the gate driver, the data driver, and the light emitting display panel. Particularly, in the light emitting display apparatus according to the present disclosure, stages included in the gate driver 200 may be provided in the display area 120, and the gate lines GL1 to GLg connected to the stages may be provided in the light emitting display panel 100.

First, the light emitting display panel 100 may include the display area 120 and the non-display area 130.

A plurality of pixels 110 displaying an image may be provided in the display area 120, and the non-display area 130 may surround the display area 120.

The gate driver 200 is shown spaced from the display area 120 in the schematic of FIG. 1 to assist in viewing the individual the circuits, however in the present disclosure, the various stages of the gate driver are physically located within the display area 120. In the present disclosure, because the stages included in the gate driver 200 are provided in the display area 120, a width of the non-display area 130 may be greatly reduced or minimized.

Particularly, in the present disclosure, the non-display area 130 may, in some embodiments, be reduced to zero so that is in not present. That is, the display area 120 may be provided in a whole surface of a front surface of the light emitting display panel 100. In this case, as described above, because the gate driver 200 connected to the gate lines is fully provided in the display area, a non-display area for the gate driver 200 does not exist. Also, for example, ends of the data lines connected to the data driver 300 may extend to an upper end of the light emitting display panel 100 illustrated in FIG. 1 and a rear surface of the light emitting display panel through a lateral surface connected to the upper end and may be connected to the data driver 300 at the rear surface of the light emitting display panel. Therefore, a non-display area for the gate driver 200 and the data driver 300 and pads for connecting the gate lines and the data lines to the gate driver 200 and the data driver 300 may is not present on the front surface of the light emitting display panel 100. Accordingly, in the present disclosure, there is not a non-display area 130, the present circuit structure and location permits the entire surface of the display panel to be the display area.

However, the present disclosure is not limited thereto. Accordingly, the non-display area 130 for arranging various lines may be provided on the display panel along one or more edges of the display panel 100 positioned adjacent to and outside the display area 120.

The gate lines GL1 to GLg, the data lines DL1 to DLd, and the pixels 110 may be provided in the display area 120. Accordingly, the display area 120 may display an image. Here, g and d may each be a natural number.

The pixel 110 included in the light emitting display panel 100, as illustrated in FIG. 2, may include a pixel driving circuit PDC, including a switching transistor Tsw1, a storage capacitor Cst, a driving transistor Tdr, and a sensing transistor Tsw2, and an emission area which includes a light emitting device ED.

A first terminal of the driving transistor Tdr may be connected to a high voltage supply line PLA through which a high voltage EVDD is supplied, and a second terminal of the driving transistor Tdr may be connected to the light emitting device ED.

A first terminal of the switching transistor Tsw1 may be connected to the data line DL, a second terminal of the switching transistor Tsw1 may be connected to a gate of the driving transistor Tdr, and a gate of the switching transistor Tsw1 may be connected to a gate line GL.

A data voltage Vdata may be supplied to a data line DL, and a gate signal GS may be supplied to the gate line GL.

The sensing transistor Tsw2 may be provided for measuring a threshold voltage or mobility of the driving transistor. A first terminal of the sensing transistor Tsw2 may be connected to a second terminal of the driving transistor Tdr and the light emitting device ED, a second terminal of the sensing transistor Tsw2 may be connected to a reference voltage line RL through which a reference voltage Vref is supplied, and a gate of the sensing transistor Tsw2 may be connected to a sensing control line SCL through which a sensing control signal SS is supplied.

A structure of the pixel 110 included in the light emitting display panel 100 is not limited to a structure illustrated in FIG. 2. Accordingly, a structure of the pixel 110 may be changed to various shapes.

An insulation layer and various electrodes configuring the pixels 110 may be provided on a base substrate (hereinafter simply referred to as a substrate) such as a glass substrate or a film. That is, the light emitting display panel 100 may include a substrate, a plurality of insulation layers provided on the substrate, and a plurality of electrodes provided on the substrate.

The data driver 300 may be provided on a chip-on film (COF) attached on the light emitting display panel 100. In this case, the data driver 300 may be connected to the data lines DL1 to DLd included in the light emitting display panel 100 and the controller 400 included in a main substrate.

The data driver 300 may be directly equipped in the light emitting display panel 100, and then, may be connected to the controller 400 included in the main substrate. In this case, the data driver 300 may be configured with transistors included in the light emitting display panel 100.

The data driver 300 may be implemented as one integrated circuit (IC) along with the controller 400. In this case, the IC may be mounted on a COF, or may be directly equipped in the light emitting display panel 100.

Moreover, as described above, the data driver 300 may be connected to an upper end of the light emitting display panel 100 and the data lines, extending to the rear surface of the light emitting display panel 100 through a lateral surface connected to the upper end, at the rear surface of the light emitting display panel 100.

The controller 400 may realign input video data transferred from an external system by using a timing synchronization signal transferred from the external system and may generate a data control signal DCS which is to be supplied to the data driver 300 and a gate control signal GCS which is to be supplied to the gate driver 200.

To this end, the controller 400 may include a data aligner which realigns input video data to generate image data Data and supplies the image data Data to the data driver 300, a control signal generator which generates the gate control signal GCS and the data control signal DCS by using the timing synchronization signal, an input unit which receives the timing synchronization signal and the input video data transferred from the external system and respectively transfers the input video data and the timing synchronization signal to the data aligner and the control signal generator, and an output unit which supplies the data driver 300 with the image data Data generated by the data aligner and the data control signal DCS generated by the control signal generator and supplies the gate driver 200 with the gate control signal GCS generated by the control signal generator.

The external system may perform a function of driving the controller 400 and an electronic device. For example, when the electronic device is a TV, the external system may receive various sound information, video information, and letter information over a communication network and may transfer the received video information to the controller 400. In this case, the image information may include input video information.

The power supply may generate various powers and may supply the generated powers to the controller 400, the gate driver 200, the data driver 300, and the light emitting display panel 100.

The gate driver 200 may supply gate pulses to the gate lines GL1 to GLg. When the gate pulse generated by the gate driver 200 is supplied to the gate of the switching transistor Tsw1 included in the pixel 110, the switching transistor Tsw1 may be turned on. When the switching transistor Tsw1 is turned on, a data voltage supplied through a data line may be supplied to the pixel 110. When a gate-off signal generated by the gate driver 200 is supplied to the switching transistor Tsw1, the switching transistor Tsw1 may be turned off. When the switching transistor Tsw1 is turned off, a data voltage may not be supplied to the pixel 110 any longer. The gate signal GS supplied to the gate line GL may include the gate pulse and the gate-off signal.

The gate driver 200 may include a plurality of stages, and the stages may be connected to the gate lines GL1 to GLg.

The stages may be included in the substrate configuring the light emitting display panel 100, and particularly, may be provided in the display area 120.

Hereinafter, a configuration and a function of the gate driver 200 will be described with reference to the drawings.

Figure 3:
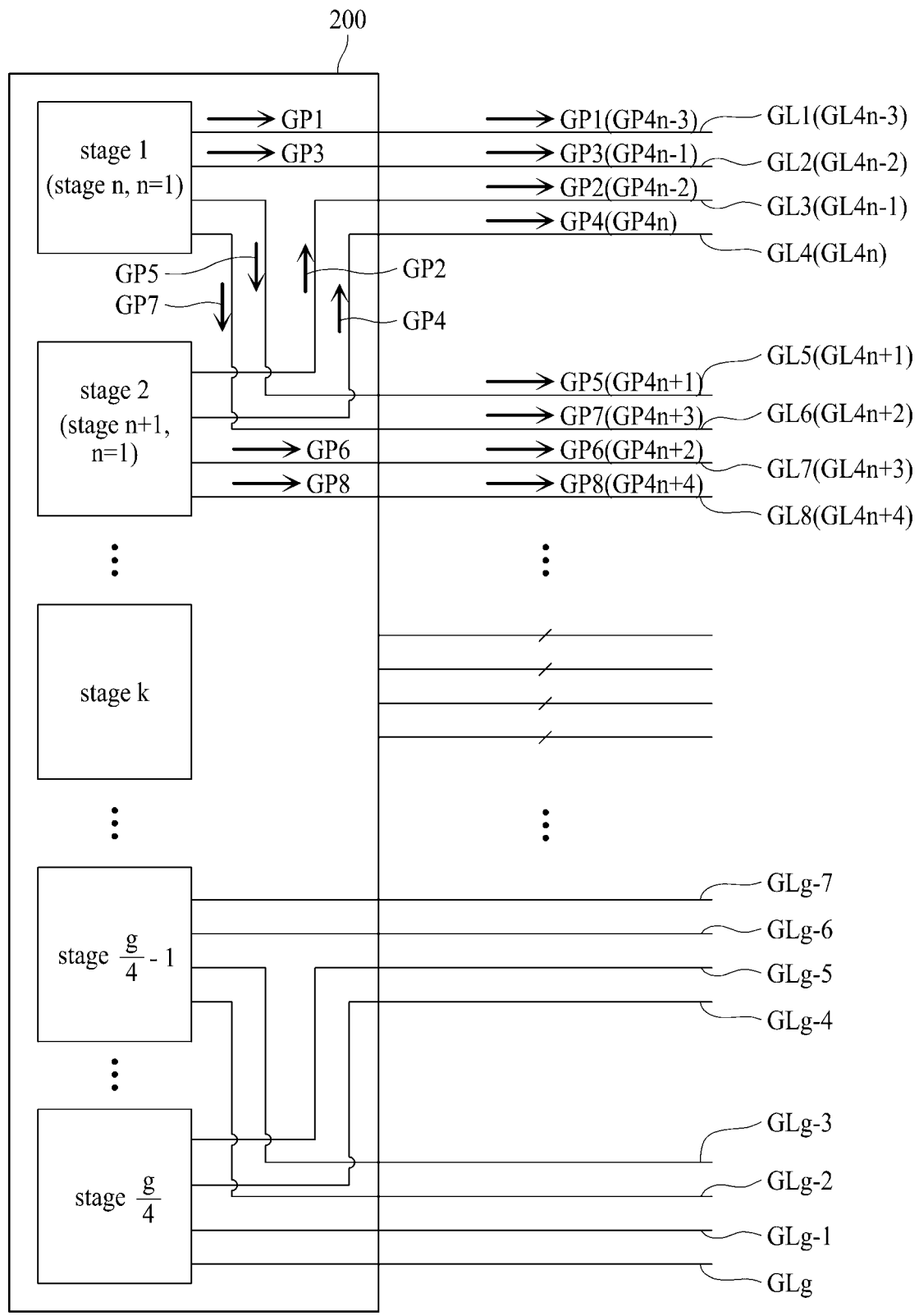
FIG. 3 is an exemplary diagram illustrating a structure of a gate driver applied to a light emitting display apparatus according to the present disclosure.

FIG. 3 is an exemplary diagram illustrating a structure of a gate driver applied to a light emitting display apparatus according to the present disclosure. In FIG. 3, n may be an odd number which is less than g.

The gate driver 200 may include first to $(g/4)^{th}$ stages Stage 1 to Stage g/4. Namely, one stage drives four gate lines. Each of the first to $(g/4)^{th}$ stages Stage 1 to Stage g/4 may output four gate pulses. In the following description, in a case where all gate pulses are described, a case where the order of gate pulses is not needed, or a case where it is not needed to limit gate driver which outputs the gate pulse, the gate pulse may be used through simple expression. In a case where a generic name for all stages is needed or a case where the order of stages is not needed, the stage may be used through simple expression. In a case where a generic name for all gate-off signals is needed or a case where the order of gate-off signals is not needed, the gate-off signal may be used through simple expression.

The first stage Stage1 may be connected a first gate line GL1, a second gate line GL2, a fifth gate line GL5, and a sixth gate line GL6, and the second stage Stage2 may be connected a third gate line GL3, a fourth gate line GL4, a seventh gate line GL7, and an eighth gate line GL8.

In this case, a first gate pulse GP1 output from the first stage may be output to the first gate line GL1, a second gate pulse GP2 output from the second stage may be output to the third gate line GL3, a third gate pulse GP3 output from the first stage may be output to the second gate line GL2, a fourth gate pulse GP4 output from the second stage may be output to the fourth gate line GL4, a fifth gate pulse GP5 output from the first stage may be output to the fifth gate line GL5, a sixth gate pulse GP6 output from the second stage may be output to the seventh gate line GL7, a seventh gate pulse GP7 output from the first stage may be output to the sixth gate line GL6, and an eighth gate pulse GP8 output from the second stage may be output to the eighth gate line GL8.

Here, GL1 to GL8 may be an arrangement order of gate lines, and GP1 to GP8 may be an output order of gate pulses. That is, in the present disclosure, gate lines may be arranged in the order of the first to eight gate lines GL1 to GL8, and gate pulses may be output in the order of the first gate line GL1, the third gate line GL3, the second gate line GL2, the fourth gate line GL4, the fifth gate line GL5, the seventh gate line GL7, the sixth gate line GL6, and the eighth gate line GL8. Hereinafter, such an order may be referred to as a zigzag form.

The gate pulses may be output in the above-described order per two stages and eight gate lines.

Figure 4:
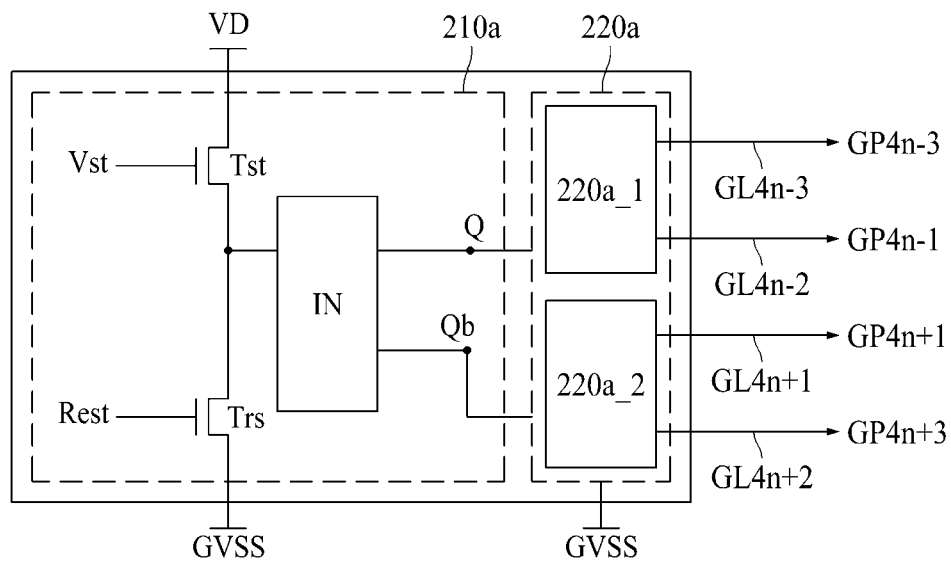
FIG. 4 is an exemplary diagram schematically illustrating a structure of each of stages illustrated in FIG. 3.
Figure 4:
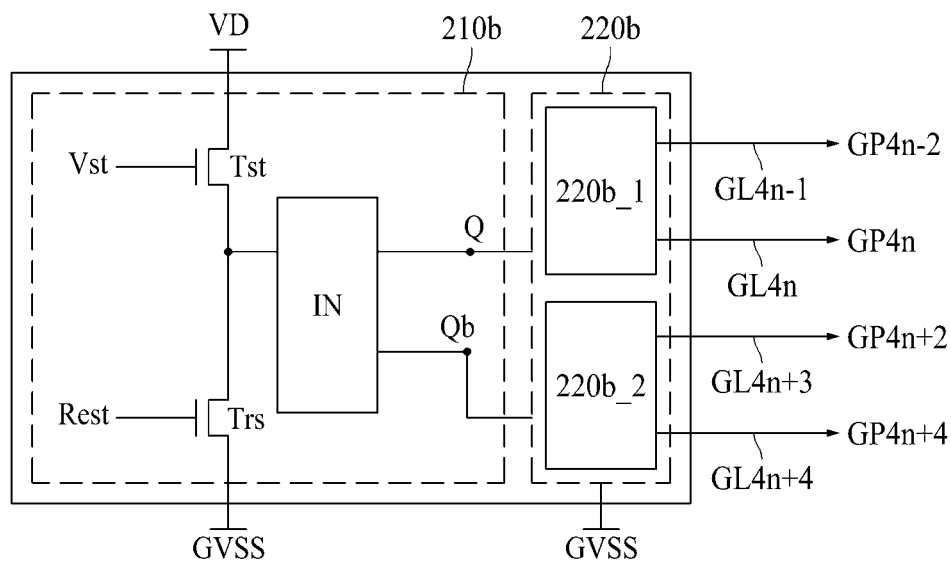
Figure 5:
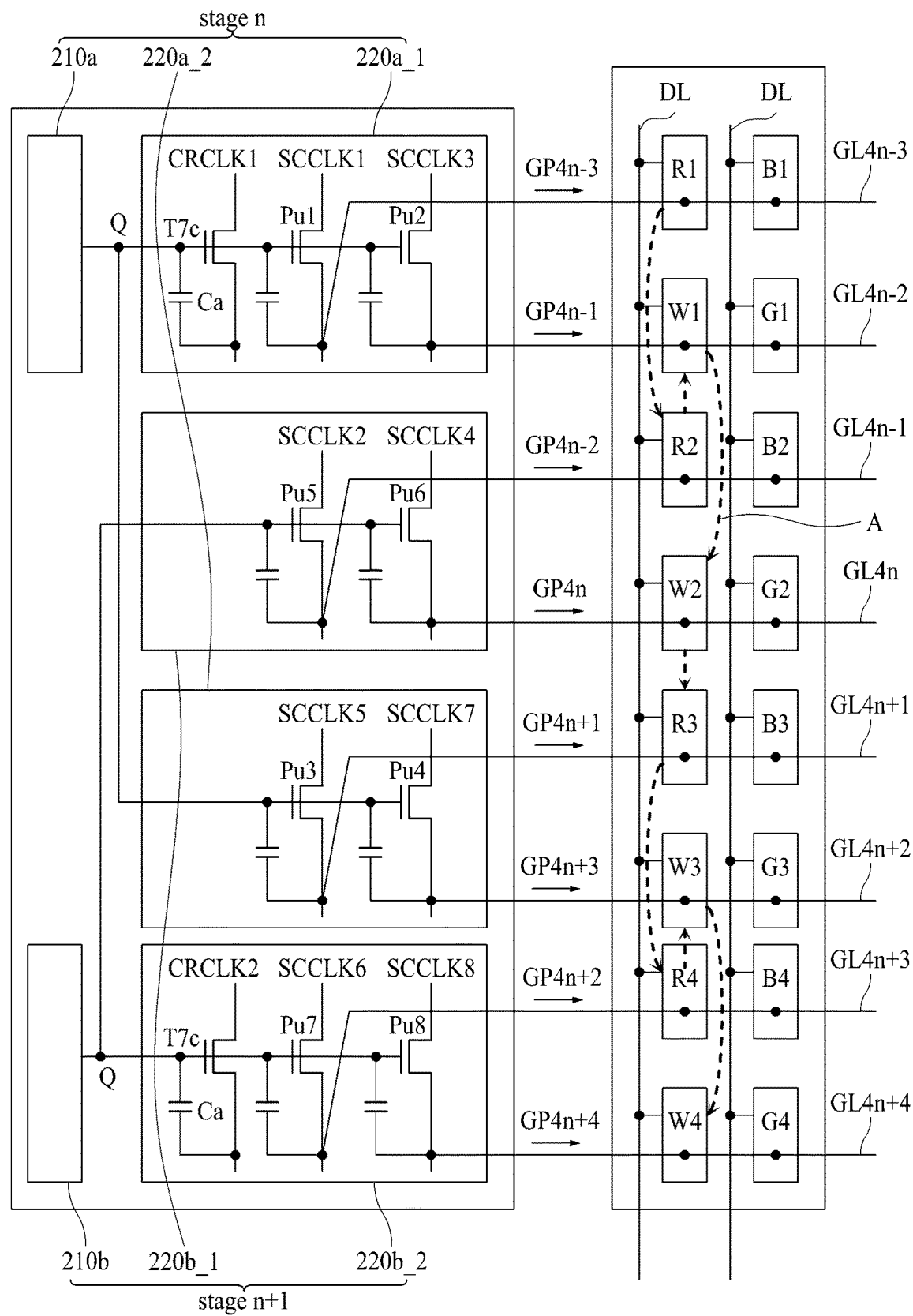
FIG. 5 is an exemplary diagram illustrating a structure of each of a first signal output unit and a second signal output unit illustrated in FIG. 4.

FIG. 4 is an exemplary diagram schematically illustrating a structure of each of the stages illustrated in FIG. 3, and particularly, is an exemplary diagram schematically illustrating an $n^{th}$ stage and an $n+1^{th}$ stage. Here, n may be real number that is odd and is less than g. FIG. 5 is an exemplary diagram illustrating a structure of each of a first signal output unit and a second signal output unit illustrated in FIG. 4.

Each of stages may include a plurality of transistors, and gate control signals GCS may be respectively supplied to the stages. Each of the stages may generate gate pulses by using various kinds of signals and voltages and may sequentially supply the gate pulses to the gate lines GL1 to GLg.

To this end, each of the stages may include a shift register and two buffers connected to the shift register.

For example, as illustrated in FIG. 4, an $n^{th}$ stage Stage n (where n is an odd number) may include a first shift register 210a and a first signal output unit 220a which outputs gate pulses GP4n-3, GP4n-1, GP4n+1, and GP4n+3 on the basis of a control signal generated by the first shift register 210a, and the first signal output unit 220a may include a 1-1$^{th}$ buffer 220a_1 and a 1-2$^{th}$ buffer 220a_2.

An $n+1^{th}$ stage Stage n+1, as illustrated in FIG. 4, may include a second shift register 210b and a second signal output unit 220b which outputs gate pulses GP4n-2, GP4n, GP4n+2, and GP4n+4 on the basis of a control signal generated by the second shift register 210b, and the second signal output unit 220b may include a 2-1$^{th}$ buffer 220b_1 and a 2-2$^{th}$ buffer 220b_2.

First, the first shift register 210a may include a plurality of transistors. In order to describe a basic structure and a basic function of the first shift register 210a applied to the present disclosure, the first shift register 210a including two transistors Tst and Trs and an inverter IN are illustrated in FIG. 4. That is, an example of the first shift register 210a applied to the present disclosure is schematically illustrated in FIG. 4.

In the first shift register 210a, a start transistor Tst may be turned on by a start signal Vst and may transfer a high voltage VD to the 1-1$^{th}$ buffer 220a_1 and the 1-2$^{th}$ buffer 220a_2 through a Q node Q. Accordingly, a gate pulse may be output from the 1-1$^{th}$ buffer 220a_1 and the 1-2$^{th}$ buffer 220a_2. The high voltage VD passing through the start transistor Tst may be shifted to a voltage, which is lower than the high voltage, by the inverter IN and may be transferred to a Qb node Qb.

When the start transistor Tst is turned off and the reset transistor Trs is turned on by a reset signal Rest, a low voltage GVSS may be supplied to the Q node Q through the reset transistor Trs. The low voltage GVSS may be shifted to a voltage, which is higher than the low voltage GVSS, by the inverter IN and may be transferred to the Qb node Qb. Therefore, a gate-off signal may be output to the 1-1$^{th}$ buffer 220a_1 and the 1-2$^{th}$ buffer 220a_2.

The inverter IN may be formed in various structures including at least one transistor so as to perform the above-describe function. That is, the first shift register 210a may be formed in various structures including at least three transistors so as to perform the above-describe function.

Second, the second shift register 210b may be formed in the same structure as that of the first shift register 210a. Accordingly, the second shift register 210b may also be formed in various structures including at least three transistors so as to perform the above-describe function.

Third, as illustrated in FIG. 5, the 1-1th buffer 220a_1 may include a first pull-up transistor Pu1 and a first pull-down transistor for outputting the gate pulse and the gate-off signal to the 4n-3$^{th}$ gate line GL4n-3 and a second pull-up transistor Pu2 and a second pull-down transistor for outputting the gate pulse and the gate-off signal to the 4n-2$^{th}$ gate line GL4n-2. The first pull-up transistor Pu1 and the second pull-up transistor Pu2 may be connected to the Q node Q of the first shift register 210a, and the first pull-down transistor and the second pull-down transistor may be connected to the Qb node Qb of the first shift register 210a.

Fourth, as illustrated in FIG. 5, the 1-2th buffer 220a_2 may include a third pull-up transistor Pu3 and a third pull-down transistor for outputting the gate pulse and the gate-off signal to the 4n+1$^{th}$ gate line GL4n+1 and a fourth pull-up transistor Pu4 and a fourth pull-down transistor for outputting the gate pulse and the gate-off signal to the 4n+2$^{th}$ gate line GL4n+2. The third pull-up transistor Pu3 and the fourth pull-up transistor Pu4 may be connected to the Q node Q of the first shift register 210a, and the third pull-down transistor and the fourth pull-down transistor may be connected to the Qb node Qb of the first shift register 210a.

A switching transistor TA7c for simultaneously supplying a signal, applied to the Q node Q, to the first to fourth pull-up transistors Pu1 to Pu4 may be included in the 1-1$^{th}$ buffer 220a_1 on the basis of an arrangement position of each of the 1-1$^{th}$ buffer 220a_1 and the 1-2$^{th}$ buffer 220a_2, and a switching clock CRCLK1 may be supplied to the switching transistor TA7c. In this case, in order to stably perform operations of the switching transistor TA7c and the first to fourth pull-up transistors Pu1 to Pu4, a capacitor may be connected to each of the switching transistor TA7c and the first to fourth pull-up transistors Pu1 to Pu4.

Fifth, as illustrated in FIG. 5, the 2-1$^{th}$ buffer 220b_1 may include a fifth pull-up transistor Pu5 and a fifth pull-down transistor for outputting the gate pulse and the gate-off signal to the 4n−1$^{th}$ gate line GL4n−1 and a sixth pull-up transistor Pub and a sixth pull-down transistor for outputting the gate pulse and the gate-off signal to the 4n$^{th}$ gate line GL4n. The fifth pull-up transistor Pu5 and the sixth pull-up transistor Pub may be connected to the Q node Q of the second shift register 210b, and the fifth pull-down transistor and the sixth pull-down transistor may be connected to the Qb node Qb of the second shift register 210b.

Sixth, as illustrated in FIG. 5, the 2-2$^{th}$ buffer 220b_2 may include a seventh pull-up transistor Pu7 and a seventh pull-down transistor for outputting the gate pulse and the gate-off signal to the 4n+3$^{th}$ gate line GL4n+3 and an eighth pull-up transistor Pu8 and an eighth pull-down transistor for outputting the gate pulse and the gate-off signal to the 4n+4$^{th}$ gate line GL4n+4. The seventh pull-up transistor Pu7 and the eighth pull-up transistor Pu8 may be connected to the Q node Q of the second shift register 210b, and the seventh pull-down transistor and the eighth pull-down transistor may be connected to the Qb node Qb of the second shift register 210b.

A switching transistor T7c for simultaneously supplying a signal, applied to the Q node Q, to the fifth to eighth pull-up transistors Pu5 to Pu8 may be included in the 2-1$^{th}$ buffer 220b_1 on the basis of an arrangement position of each of the 2-1$^{th}$ buffer 220b_1 and the 2-2$^{th}$ buffer 220b_2, and the switching clock CRCLK1 may be supplied to the switching transistor T7c. In this case, in order to stably perform operations of the switching transistor T7c and the fifth to eighth pull-up transistors Pu5 to Pu8, a capacitor may be connected to each of the switching transistor T7c and the fifth to eighth pull-up transistors Pu5 to Pu8.

That is, the 1-1$^{th}$ buffer 220a_1 and the 2-1$^{th}$ buffer 220b_1 may alternately output gate pulses, and the 1-2$^{th}$ buffer 220a_2 and the 2-2$^{th}$ buffer 220b_2 may alternately output gate pulses.

In this case, based on first to eighth gate clocks SCCLK1 to SCCLK8 supplied to the n$^{th}$ stage and the n+1$^{th}$ stage, the 4n−3$^{th}$ to 4n+4$^{th}$ gate pulses GP4n−3 to GP4n+4 may be sequentially output and may be supplied to the 4n−3$^{th}$ gate line GL4n−3, the 4n−1$^{th}$ gate line GL4n−1, the 4n−2$^{th}$ gate line GL4n−2, the 4n$^{th}$ gate line GL4n, the 4n+1$^{th}$ gate line GL4n+1, the 4n+3$^{th}$ gate line GL4n+3, the 4n+2$^{th}$ gate line GL4n+2, and the 4n+4$^{th}$ gate line GL4n+4.

Therefore, as illustrated by dotted-line arrows A in FIG. 5, pixels arranged along data lines DL may be driven in a zigzag form.

That is, according to the present disclosure, after a data voltage is supplied to a first red pixel R1, a data voltage may be supplied to a second red pixel R2, and after a data voltage is supplied to a first white pixel W1, a data voltage may be supplied to a second white pixel W2.

Therefore, according to the present disclosure, data toggling may decrease by ½. When data toggling is reduced, a problem where heat occurs in an IC configuring a data driver may be solved. Accordingly, the quality of the display apparatus according to the present disclosure may be enhanced.

Figure 6:
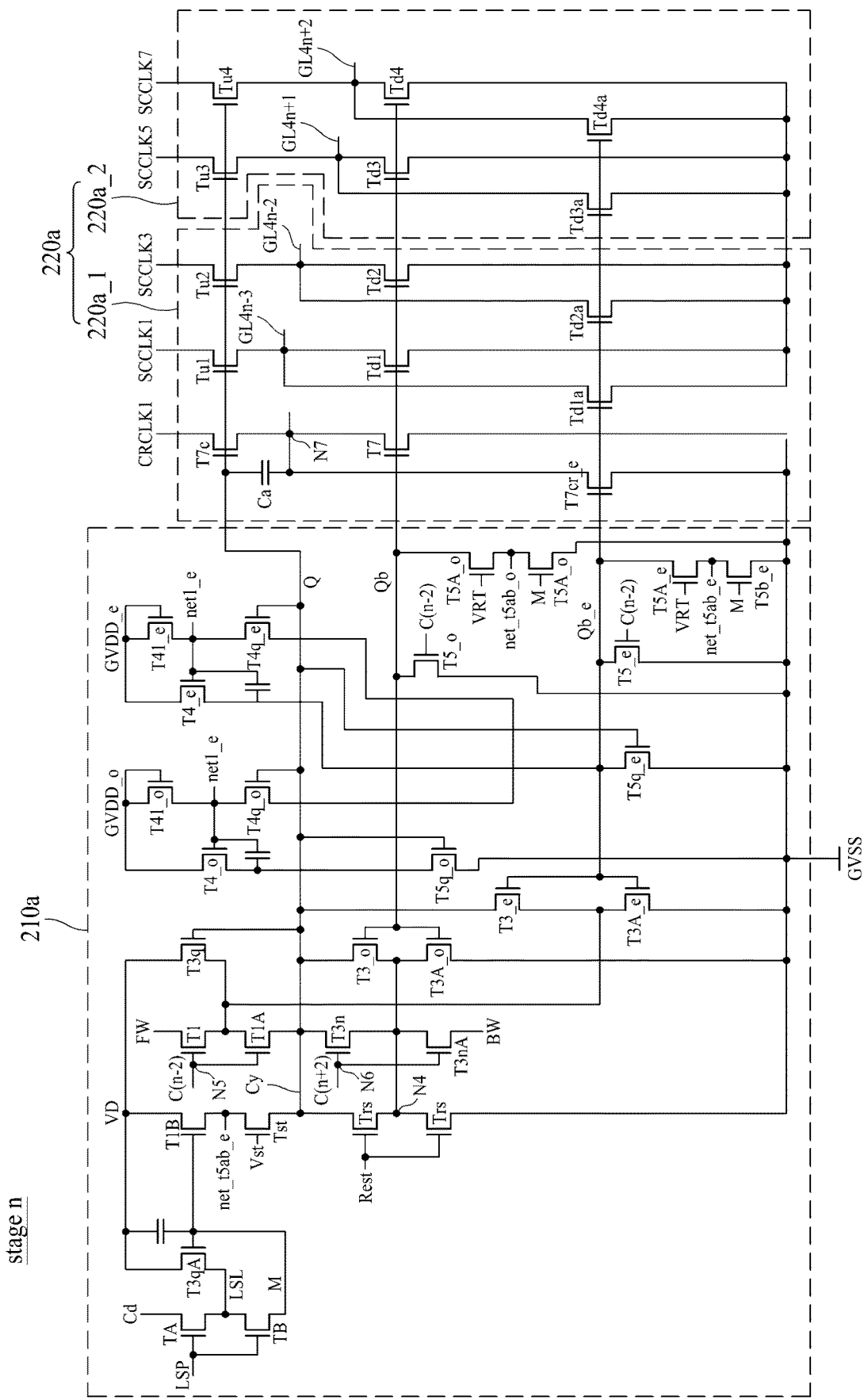
FIG. 6 is an exemplary diagram illustrating in detail a stage described above with reference to FIGS. 3 to 5.

FIG. 6 is an exemplary diagram illustrating in detail the stage described above with reference to FIGS. 3 to 5. A detailed structure of a stage may not be a feature of the present disclosure, and thus, detailed descriptions of a detailed structure and function of each of transistors illustrated in FIG. 6 are omitted and a basic structure and function of a stage will be described with reference to FIG. 6. Hereinafter, an n$^{th}$ stage will be described with reference to FIG. 6, and the following description may be applied to an n+1$^{th}$ stage.

For example, in a first shift register 210a configuring an n$^{th}$ stage Stage n illustrated in FIG. 6, when a start transistor Tst is turned on by a start signal Vst, a high voltage VD may be supplied to a 1-1$^{th}$ buffer 220a_1 and a 1-2$^{th}$ buffer 220a_2 through a Q node Q. A switching transistor T7c and a capacitor Ca provided at front ends of the 1-1$^{th}$ buffer 220a_1 and the 1-2$^{th}$ buffer 220a_2 may perform a function of stably supplying the high voltage VD, supplied to the Q node Q, to the 1-1$^{th}$ buffer 220a_1 and the 1-2$^{th}$ buffer 220a_2.

In this case, by a first gate clock SCCLK1, a third gate clock SCCLK3, a fifth gate clock SCCLK5, and a seventh gate clock SCCLK7 which are sequentially input, first to fourth pull-up transistors Tu1 to Tu4 may be sequentially turned on and a 4n−3$^{th}$ gate pulse GP4n−3, a 4n−1$^{th}$ gate pulse GP4n−1, a 4n+1$^{th}$ gate pulse GP4n+1, and a 4n+3$^{th}$ gate pulse GP4n+3 may be sequentially output to a 4n−3$^{th}$ gate line GL4n−3, a 4n−1$^{th}$ gate line GL4n−1, a 4n+1$^{th}$ gate line GL4n+1, and a 4n+3$^{th}$ gate line GL4n+3.

Moreover, when the start transistor Tst is turned off and the reset transistor Trs is turned on by a reset signal Rest, a low voltage GVSS may be supplied to the Q node Q through the reset transistor Trs. In this case, because the first to fourth pull-up transistors Tu1 to Tu4 are turned off by the low voltage GVSS, the 1-1$^{th}$ buffer 220a_1 and the 1-2$^{th}$ buffer 220a_2 may not output gate pulse any longer.

In this case, the low voltage GVSS may be shifted to a voltage, which is higher than the low voltage GVSS, by a circuit configuring the inverter IN and may be supplied to the Qb node Qb. Therefore, a gate-off signal may be output through first to fourth pull-down transistors Td1 to Td4 included in the 1-1$^{th}$ buffer 220a_1 and the 1-2$^{th}$ buffer 220a_2. In FIG. 6, a voltage which is higher than the low voltage GVSS may be alternately supplied to the Qb node Qb and a Qb_e node Qb_e. That is, the gate-off signal may be continuously output to a gate line in all periods, except a timing at which the gate pulse is output, of one frame period. In this case, when the gate-off signal output to one gate line is output by one pull-down transistor, the one pull-down transistor may be degraded for a short time. In order to solve such a problem, as illustrated in FIG. 6, two pull-down transistors may be provided in one gate line, and a voltage which is higher than the low voltage GVSS may be alternately supplied to the Qb node Qb and the Qb_e node Qb_e. For example, in a first frame, the first pull-down transistor Td1 may be turned on and the gate-off signal may be output to the $4n-3^{th}$ gate line GL$4n$-3 through the first pull-down transistor Td1, and in a second frame, a $1\text{-}1^{th}$ pull-down transistor Td1$a$ may be turned on and the gate-off signal may be output to the $4n-3^{th}$ gate line GL$4n$-3 through the $1\text{-}1^{th}$ pull-down transistor Td1$a$. Also, $2\text{-}1^{th}$ to $4\text{-}1^{th}$ transistors Td2$a$ to Td4$a$ and second to fourth pull-down transistors Td2 to Td4 may be alternately turned on.

The first shift register 210$a$ illustrated in FIG. 6, as described above with reference to FIG. 4, may include the start transistor Tst, the reset transistor Trs, and various transistors configuring the inverter IN.

In this case, a second shift register 210$b$, a $2\text{-}1^{th}$ buffer 220$b$_1, and a $2\text{-}2^{th}$ buffer 220$b$_2 configuring an $n+1^{th}$ stage may be configured in the same form as the first shift register 210$a$, the $1\text{-}1^{th}$ buffer 220$a$_1, and the $1\text{-}2^{th}$ buffer 220$a$_2 configuring the $n^{th}$ stage.

Figure 7:
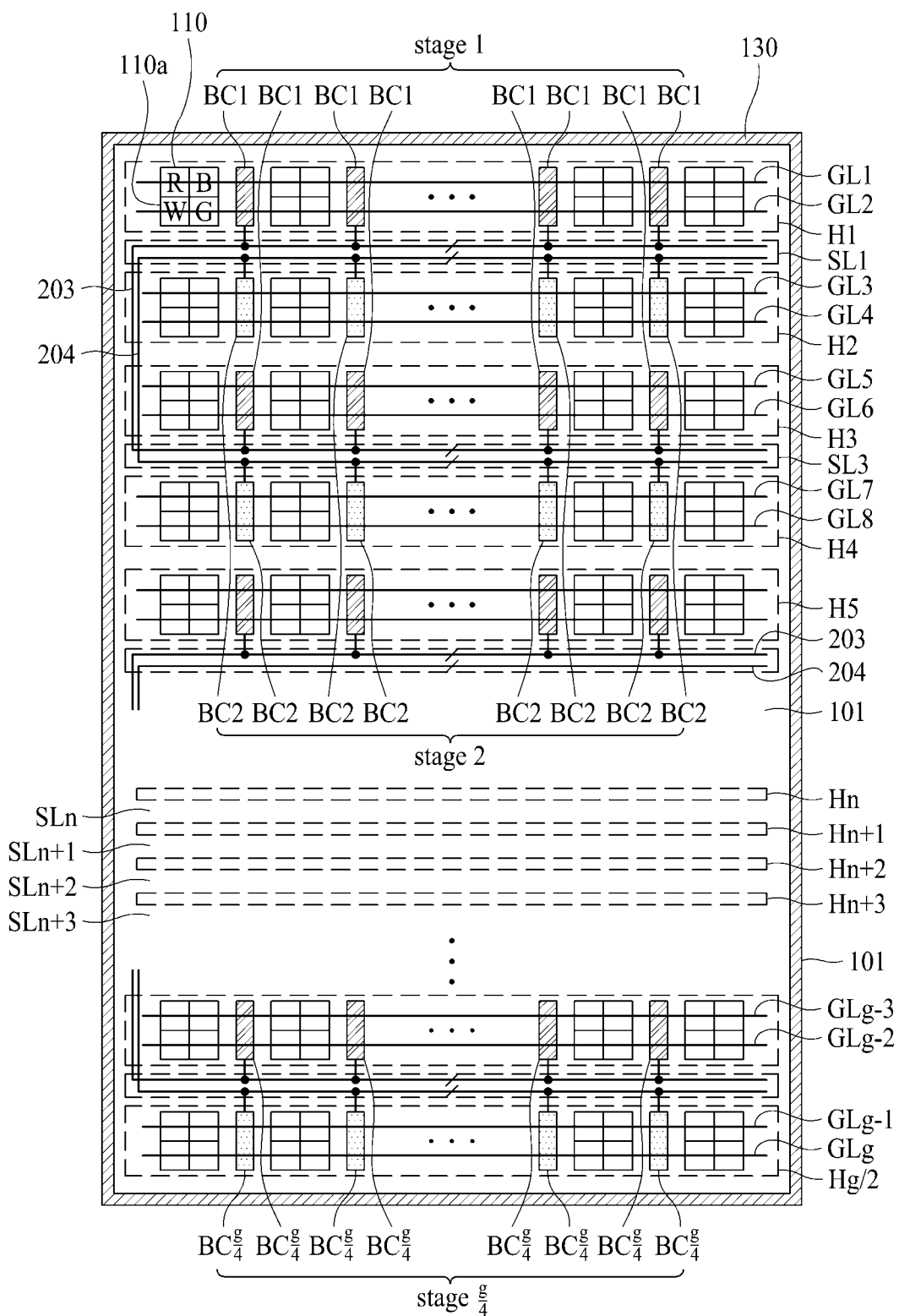
FIG. 7 is an exemplary diagram illustrating a structure of a light emitting display panel applied to a light emitting display apparatus according to the present disclosure.
Figure 8:
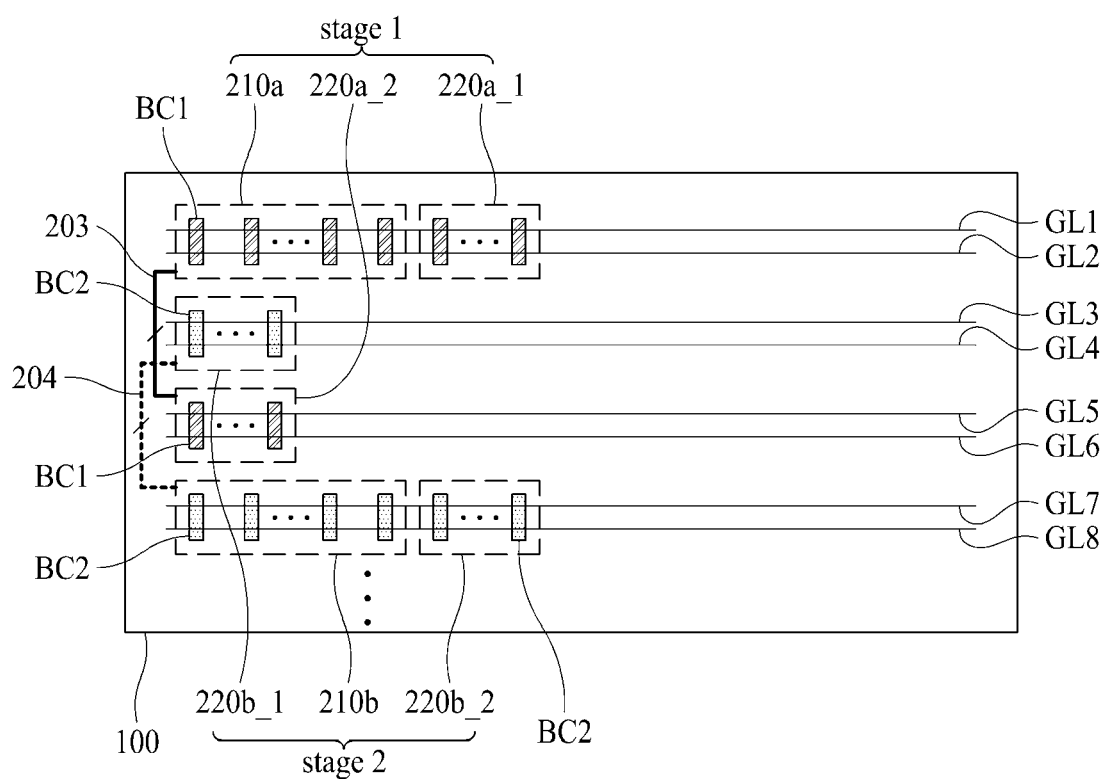
FIG. 8 is an exemplary diagram illustrating an arrangement structure of stages applied to a light emitting display apparatus according to the present disclosure.
Figure 9:
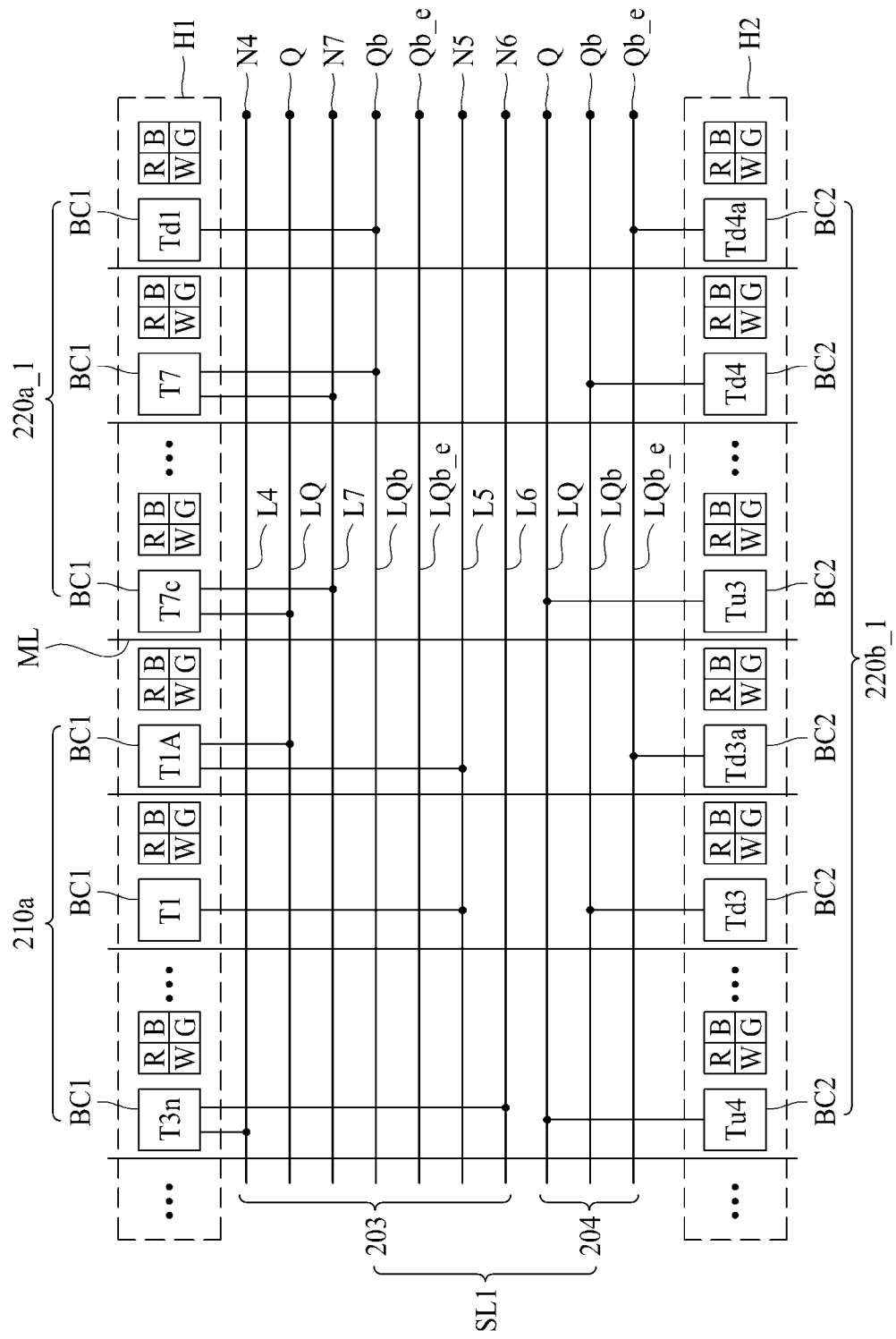
FIG. 9 is an exemplary diagram illustrating signal lines provided in a horizontal portion illustrated in FIG. 8.
Figure 10:
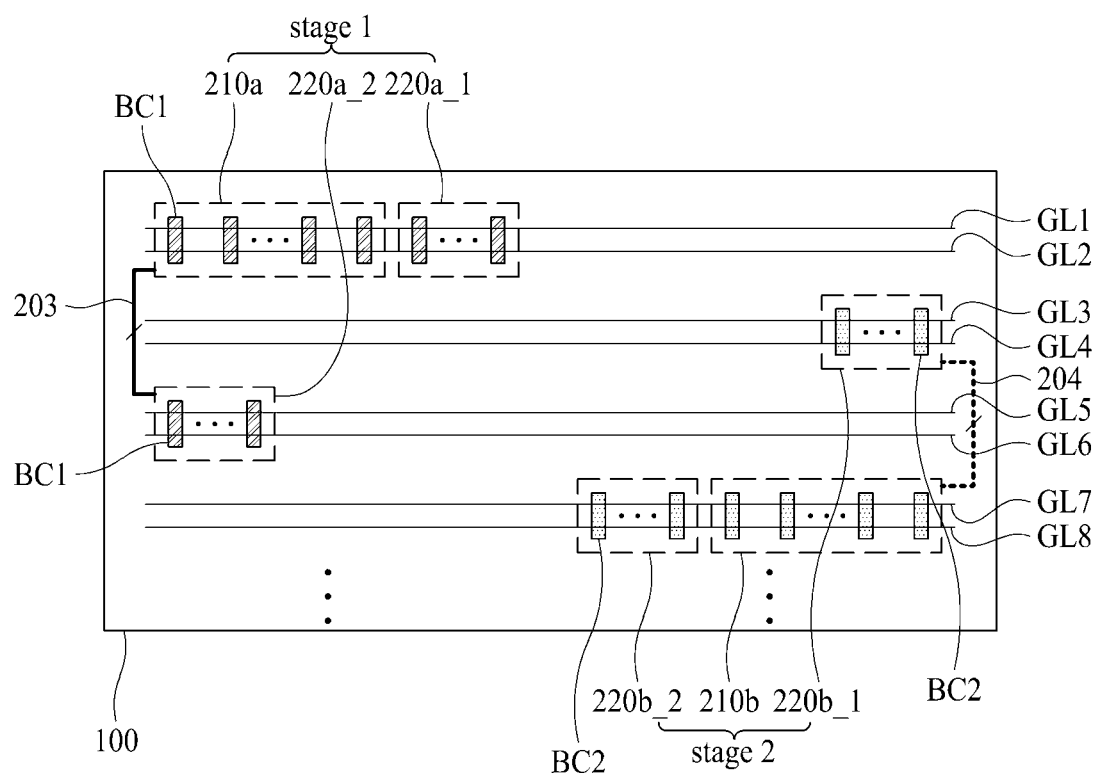
FIG. 10 is another exemplary diagram illustrating an arrangement structure of stages applied to a light emitting display apparatus according to the present disclosure.

FIG. 7 is an exemplary diagram illustrating a structure of a light emitting display panel applied to a light emitting display apparatus according to the present disclosure, FIG. 8 is an exemplary diagram illustrating an arrangement structure of stages applied to a light emitting display apparatus according to the present disclosure, FIG. 9 is an exemplary diagram illustrating signal lines provided in a horizontal portion illustrated in FIG. 8, and FIG. 10 is another exemplary diagram illustrating an arrangement structure of stages applied to a light emitting display apparatus according to the present disclosure. In the following description, details which are the same or similar to details described above with reference to FIGS. 1 to 6 are omitted or will be briefly described.

The light emitting display apparatus according to the present disclosure may include a gate driver 300 including stages Stage1 to Stage$g$/4 included in a substrate 101 and gate lines GL1 to GL$g$ connected to the stages Stage1 to Stage$g$/4.

Each of the stages Stage1 to Stage$g$/4, as described above with reference to FIGS. 3 to 6, may include a shift register and two buffers connected to the shift register.

First, a $1\text{-}1^{th}$ buffer 220$a$_1 of two buffers configuring an $n^{th}$ stage Stage n and a first shift register 210$a$ configuring the $n^{th}$ stage Stage n may be provided in an $n^{th}$ horizontal portion H$n$, and a $1\text{-}2^{th}$ buffer 220$a$_2 of the two buffers may be provided in an $n+2^{th}$ horizontal portion H$n$+2 (where n is an odd number).

Moreover, a $2\text{-}2^{th}$ buffer 220$b$_2 of two buffers configuring an $n+1^{th}$ stage Stage n+1 and a second shift register 210$b$ configuring the $n+1^{th}$ stage Stage n+1 may be provided in an $n+3^{th}$ horizontal portion H$n$+3, and a $2\text{-}1^{th}$ buffer 220$b$_1 of the two buffers may be provided in an $n+1^{th}$ horizontal portion H$n$+1.

The $n^{th}$ horizontal portion H$n$ may be a region including pixels which are arranged along a $4n-3^{th}$ gate line and a $4n-2^{th}$ gate line, the $n+1^{th}$ horizontal portion H$n$+1 may be a region including pixels which are arranged along a $4n-1^{th}$ gate line and a $4n^{th}$ gate line, the $n+2^{th}$ horizontal portion H$n$+2 may be a region including pixels which are arranged along a $4n+1^{th}$ gate line and a $4n+2^{th}$ gate line, and the $n+3^{th}$ horizontal portion H$n$+3 may be a region including pixels which are arranged along a $4n+3^{th}$ gate line and a $4n+4^{th}$ gate line.

For example, when n is 1, as illustrated in FIGS. 7 and 8, a $1\text{-}1^{th}$ buffer 220$a$_1 of two buffers configuring a first stage Stage1 and a first shift register 210$a$ configuring the first stage Stage1 may be provided in a first horizontal portion H1, and a $1\text{-}2^{th}$ buffer 220$a$_2 of the two buffers may be provided in a third horizontal portion H3.

Moreover, a $2\text{-}2^{th}$ buffer 220$b$_2 of two buffers configuring a second stage Stage2 and a second shift register 210$b$ configuring the second stage Stage2 may be provided in a fourth horizontal portion H4, and a $2\text{-}1^{th}$ buffer 220$b$_1 of the two buffers may be provided in a second horizontal portion H2.

The first horizontal portion H1 may be a region including pixels which are arranged along a first gate line GL1 and a second gate line GL2, the second horizontal portion H2 may be a region including pixels which are arranged along a third gate line GL3 and a fourth gate line GL4, the third horizontal portion H3 may be a region including pixels which are arranged along a fifth gate line GL5 and a sixth gate line GL6, and the fourth horizontal portion H4 may be a region including pixels which are arranged along a seventh gate line GL7 and an eighth gate line GL8.

That is, in the present disclosure, each horizontal portion may include a branch circuit unit BC which includes at least one transistor configuring a stage. The branch circuit unit BC, as illustrated in FIG. 7, may be provided between pixels 110. Particularly, the branch circuit unit BC may be provided between unit pixels 110$a$ arranged along two gate lines adjacent to each other.

For example, when the unit pixel 110$a$ include a red pixel R, a blue pixel B, a white pixel W, and a green pixel G, as illustrated in FIG. 7, four pixels 110 may be arranged along two gate lines (for example, GL1 and GL2) adjacent to each other. Particularly, the red pixel R and the blue pixel B may be arranged adjacent to each other along one gate line (for example, GL1), the white pixel W and the green pixel G may be arranged adjacent to each other along one other gate line (for example, GL2), and the red pixel R, the blue pixel B, the white pixel W, and the green pixel G may be arranged adjacent to one another.

In this case, the unit pixel 110$a$ and the branch circuit unit BC may be alternately arranged along two gate lines (for example, GL1 and GL2) adjacent to each other.

However, when the number of unit pixels 110$a$ is more than the number of transistors provided in one horizontal portion H, a transistor may not be provided in the branch circuit unit BC. That is, there may be a branch circuit unit BC including no transistor. Hereinafter, a branch circuit unit BC including no transistor may be simply referred to as a dummy branch circuit.

To provide an additional description, thirty transistors may be included in the first shift register 210$a$ illustrated in FIG. 6, nine transistors may be provided in the $1\text{-}1^{th}$ buffer 220$a$_1, and sixth transistors may be provided in the $1\text{-}2^{th}$ buffer 220$a$_2.

In this case, thirty-nine transistors may be included in the first shift register 210$a$ and the $1\text{-}1^{th}$ buffer 220$a$_1. Therefore, thirty-nine first branch circuit units BC1 may be included in a horizontal portion where the first shift register 210$a$ and the $1\text{-}1^{th}$ buffer 220$a$_1 are provided, and six first branch circuit units BC1 may be included in a horizontal portion where the $1\text{-}2^{th}$ buffer 220$a$_2 is provided.

Therefore, thirty-nine second branch circuit units BC2 may be included in a horizontal portion where the second shift register 210$b$ and the $2\text{-}2^{th}$ buffer 220$b$_2 are provided, and six second branch circuit units BC2 may be included in a horizontal portion where the 2-1$^{th}$ buffer 220b_1 is provided.

The 1-1$^{th}$ buffer 220a_1 configuring the n$^{th}$ stage Stage n may be connected to the 4n-3$^{th}$ gate line GL4n-3 and the 4n-2$^{th}$ gate line GL4n-2, and the 1-2$^{th}$ buffer 220a_2 configuring the n$^{th}$ stage Stage n may be connected to the 4n+1$^{th}$ gate line GL4n+1 and the 4n+2$^{th}$ gate line GL4n+2.

For example, when n is 1, as illustrated in FIGS. 3 to 8, the 1-1$^{th}$ buffer 220a_1 configuring the first stage Stage1 may be connected to a first gate line GL1 and a second gate line GL2, and the 1-2$^{th}$ buffer 220a_2 configuring the first stage Stage1 may be connected to a fifth gate line GL5 and a sixth gate line GL6.

The 2-2$^{th}$ buffer 220b_2 configuring the n+1$^{th}$ stage Stage n+1 may be connected to a 4n+3$^{th}$ gate line GL4n+3 and a 4n+4$^{th}$ gate line GL4n+4, and the 2-1$^{th}$ buffer 220b_1 configuring the n+1$^{th}$ stage Stage n+1 may be connected to a 4n-1$^{th}$ gate line GL4n-1 and a 4n$^{th}$ gate line GL4n.

For example, when n is 1, as illustrated in FIGS. 3 to 8, the 2-2$^{th}$ buffer 220b_2 configuring the second stage Stage2 may be connected to a seventh gate line GL7 and an eighth gate line GL8, and the 2-1$^{th}$ buffer 220b_1 configuring the second stage Stage2 may be connected to a third gate line GL3 and a fourth gate line GL4.

At least one n$^{th}$ signal line 203 connected to the 1-1$^{th}$ buffer 220a_1 and the first shift register 210a and three n+1$^{th}$ signal lines 204 connected to the 2-1$^{th}$ buffer 220b_1 may be provided in an n$^{th}$ signal line portion SLn between the n$^{th}$ horizontal portion Hn and the n+1$^{th}$ horizontal portion Hn+1.

Three n$^{th}$ signal lines of the at least one n$^{th}$ signal line 203 may extend to an n+2$^{th}$ signal line portion SLn+2 between an n+2$^{th}$ horizontal portion Hn+2 and an n+3$^{th}$ horizontal portion Hn+3.

The three n+1$^{th}$ signal lines 204 may extend to the n+2$^{th}$ signal line portion SLn+2.

At least one n+1$^{th}$ signal line connected to the 2-2$^{th}$ buffer 220b_2 and the second shift register 210b may be further provided in the n+2$^{th}$ signal line portion SLn+2.

For example, when n is 1, as illustrated in FIGS. 7 to 9, at least one first signal line 203 connected to the 1-1$^{th}$ buffer 220a_1 and the first shift register 210a and three second signal lines 204 connected to the 2-1$^{th}$ buffer 220b_1 may be provided in the first signal line portion SL1 between the first horizontal portion H1 and the second horizontal portion H2.

Three first signal lines 203 of the at least one n$^{th}$ signal line 203 may extend to a third signal line portion SL3 between a third horizontal portion H3 and a fourth horizontal portion H4.

Three second signal lines 204 may extend to the third signal line portion SL3.

At least one second signal line 204 connected to the 2-2$^{th}$ buffer 220b_2 and the second shift register 210b may be further provided in the at least one second signal line 204.

Here, the n$^{th}$ signal lines 203 or the first signal line 203 may denote lines included in the n$^{th}$ stage Stage n, and the n+1$^{th}$ signal lines 204 or the second signal line 204 may denote lines included in the n+1$^{th}$ stage Stage n+1.

For example, in a case where a stage applied to the present disclosure is implemented as in FIG. 6, seven n$^{th}$ signal lines 203 and three n+1$^{th}$ signal lines 204 may be included in the n$^{th}$ horizontal portion Hn as illustrated in FIG. 9.

The seven n$^{th}$ signal lines 203 may include lines LQ, LQb, LQb_e, and L4 to L7 connected to a Q node Q, a Qb node Qb, a Qb_e node Qb_e, and fourth to seventh nodes N4 to N7 included in the nth stage Stage n illustrated in FIG. 6.

The three n+1$^{th}$ signal lines 204 may include lines LQ, LQb, and LQb_e connected to a Q node Q, a Qb node Qb, and a Qb_e node Qb_e included in the n+1$^{th}$ stage Stage n+1.

To provide an additional description, as illustrated in FIGS. 7 to 9, seven first signal lines 203 connected to the 1-1$^{th}$ buffer 220a_1 and the first shift register 210a and three second signal lines 204 connected to the 2-1$^{th}$ buffer 220b_1 may be provided in the first signal line portion SL1 between the first horizontal portion H1 and the second horizontal portion H2.

However, the number of first signal lines 203 and the number of second signal lines 204 may be variously changed based on a structure of a stage Stage.

A line LQ connected to a Q node included in the n$^{th}$ stage, a line LQb connected to a Qb node, and a line LQb_e connected to a Qb_e node may be connected to the 1-1$^{th}$ buffer 220a_1 and the 1-2$^{th}$ buffer 220a_2 in common.

Moreover, a line LQ connected to a Q node included in the n+1$^{th}$ stage, a line LQb connected to a Qb node, and a line LQb_e connected to a Qb_e node may be connected to the 2-1$^{th}$ buffer 220b_1 and the 2-2$^{th}$ buffer 220b_2 in common.

Therefore, three n$^{th}$ signal lines 203 included in the n+2$^{th}$ signal line portion SLn+2 may be connected to the 1-2$^{th}$ buffer 220a_2, and three n+1$^{th}$ signal lines 204 included in the n+2$^{th}$ signal line portion SLn+2 may be connected to the 2-2$^{th}$ buffer 220b_2 and the second shift register 210b.

For example, in FIG. 9, three lines (i.e., a line LQ connected to a Q node, a line LQb connected to a Qb node, and a line LQb_e connected to a Qb_e node) connected to the 1-1$^{th}$ buffer 220a_1 may extend to the third signal line portion SL3 and may be connected to the 1-2$^{th}$ buffer 220a_2.

Moreover, in FIG. 9, three lines (i.e., a line LQ connected to a Q node, a line LQb connected to a Qb node, and a line LQb_e connected to a Qb_e node) connected to the 2-1$^{th}$ buffer 220b_1 may extend to the third signal line portion SL3 and may be connected to the 2-1$^{th}$ buffer 220b_1 and the second shift register 210b.

In this case, three n$^{th}$ signal lines 203 extending from the first signal line portion SL1, three n+1$^{th}$ signal lines 204 extending from the first signal line portion SL1, and four n+1$^{th}$ signal lines connected to the 2-1$^{th}$ buffer 220b_1 and the second shift register 210b may be included in the third signal line portion SL3.

Therefore, ten signal lines may be included in each of the first signal line portion SL1 and the third signal line portion SL3.

That is, in the n$^{th}$ stage Stage n illustrated in FIG. 6, the first shift register 210a, the 1-1$^{th}$ buffer 220a_1, and the 1-2$^{th}$ buffer 220a_2 may be connected by seven signal lines, and the 1-1$^{th}$ buffer 220a_1 and the 1-2$^{th}$ buffer 220a_2 may be connected by three signal lines.

Therefore, in the n+1$^{th}$ stage Stage n+1 implemented in the same structure as the n$^{th}$ stage Stage n, the second shift register 210b, the 2-1$^{th}$ buffer 220b_1, and the 2-2$^{th}$ buffer 220b_2 may be connected by seven signal lines, and the 2-1$^{th}$ buffer 220b_1 and the 2-2$^{th}$ buffer 220b_2 may be connected by three signal lines.

As a structure of each of the n$^{th}$ stage and the n+1$^{th}$ stage is changed, the number of signal lines included in each of signal line portions may be changed.

In this case, signal lines may not be provided in an upper end of the first horizontal portion H1, a second signal line portion between the second horizontal portion H2 and the third horizontal portion H3, and a fourth signal line portion between the fourth horizontal portion H4 and the fifth horizontal portion H5.

However, a width of an upper end of the first horizontal portion H1, a width of each of horizontal portions, and a width of a lower end of a $(g/2)^{th}$ horizontal portion Hg/2 may be equally formed. Accordingly, all regions of a light emitting display panel may be formed in the same structure.

Moreover, metal lines ML illustrated in FIG. 9 may be lines to which high voltages VD, GVDD_o, and GVDD_e, a low voltage GVSS, and clocks CRCLK1, SCCLK1, SCCLK3, SCCLK5, and SCCLK7 illustrated in FIG. 6 are supplied. There may be a dummy metal line, to which any signal is not supplied, among the metal lines ML illustrated in FIG. 9.

As described above, three $n^{th}$ signal lines 203 and three $n+1^{th}$ signal lines 204 should extend to the same signal line portions SL.

In this case, one-side ends of three $n^{th}$ signal lines 203 included in the $n^{th}$ signal line portion SLn and one-side ends of three $n+1^{th}$ signal lines 204 included in the $n+1^{th}$ signal line portion SLn+1 may extend to the $n+2^{th}$ signal line portion SLn+2 through the same region as illustrated in FIGS. 7 and 8.

To provide an additional description, the one-side ends of the three $n^{th}$ signal lines 203 included in the $n^{th}$ signal line portion SLn may extend to the $n+2^{th}$ signal line portion SLn+2 through a first region where one-side ends of gate lines included in the $n+1^{th}$ horizontal portion Hn+1 and the $n+2^{th}$ horizontal portion Hn+2 are provided, and the one-side ends of the three $n+1^{th}$ signal lines 204 included in the $n^{th}$ signal line portion SLn may extend to the $n+2^{th}$ signal line portion SLn+2 through the first region. Here, the first region may be a left end of the light emitting display panel, or may be a right end thereof.

That is, in the light emitting display panel illustrated in FIGS. 7 and 8, the one-side ends of the three $n^{th}$ signal lines 203 included in the $n^{th}$ signal line portion SLn and the one-side ends of the three $n+1^{th}$ signal lines 204 included in the $n+1^{th}$ signal line portion SLn+1 may extend to the $n+2^{th}$ signal line portion SLn+2 through the left end of the light emitting display panel.

However, the one-side ends of the three $n^{th}$ signal lines 203 included in the $n^{th}$ signal line portion SLn and the one-side ends of the three $n+1^{th}$ signal lines 204 included in the $n+1^{th}$ signal line portion SLn+1 may extend to the $n+2^{th}$ signal line portion SLn+2 through the right end of the light emitting display panel.

Finally, the one-side ends of the three $n^{th}$ signal lines 203 included in the $n^{th}$ signal line portion SLn and the one-side ends of the three $n+1^{th}$ signal lines 204 included in the $n+1^{th}$ signal line portion SLn+1 may extend to the $n+2^{th}$ signal line portion SLn+2 through different regions.

To provide an additional description, the one-side ends of the three $n^{th}$ signal lines 203 included in the $n^{th}$ signal line portion SLn may extend to the $n+2^{th}$ signal line portion SLn+2 through the first region where the one-side ends of the gate lines included in the $n+1^{th}$ horizontal portion Hn+1 and the $n+2^{th}$ horizontal portion Hn+2 are provided, and the one-side ends of the three $n^{th}$ signal lines 203 included in the $n^{th}$ signal line portion SLn may extend to the $n+2^{th}$ signal line portion SLn+2 through a second region where the other-side ends of the gate lines included in the $n+1^{th}$ horizontal portion Hn+1 and the $n+2^{th}$ horizontal portion Hn+2 are provided. Here, the first region and the second region may denote opposite regions facing each other. For example, in FIG. 7, the first region may be between a left end of the gate line GL and an end of the light emitting display panel, and the second region may be between a right end of the gate line GL and the end of the light emitting display panel.

That is, in the light emitting display panel illustrated in FIG. 10, the one-side ends of the three $n^{th}$ signal lines 203 included in the $n^{th}$ signal line portion SLn may extend to the $n+2^{th}$ signal line portion SLn+2 through a left end of the light emitting display panel, and the one-side ends of the three $n+1^{th}$ signal lines 204 included in the $n+1^{th}$ signal line portion SLn+1 may extend to the $n+2^{th}$ signal line portion SLn+2 through a right end of the light emitting display panel.

Figure 11:
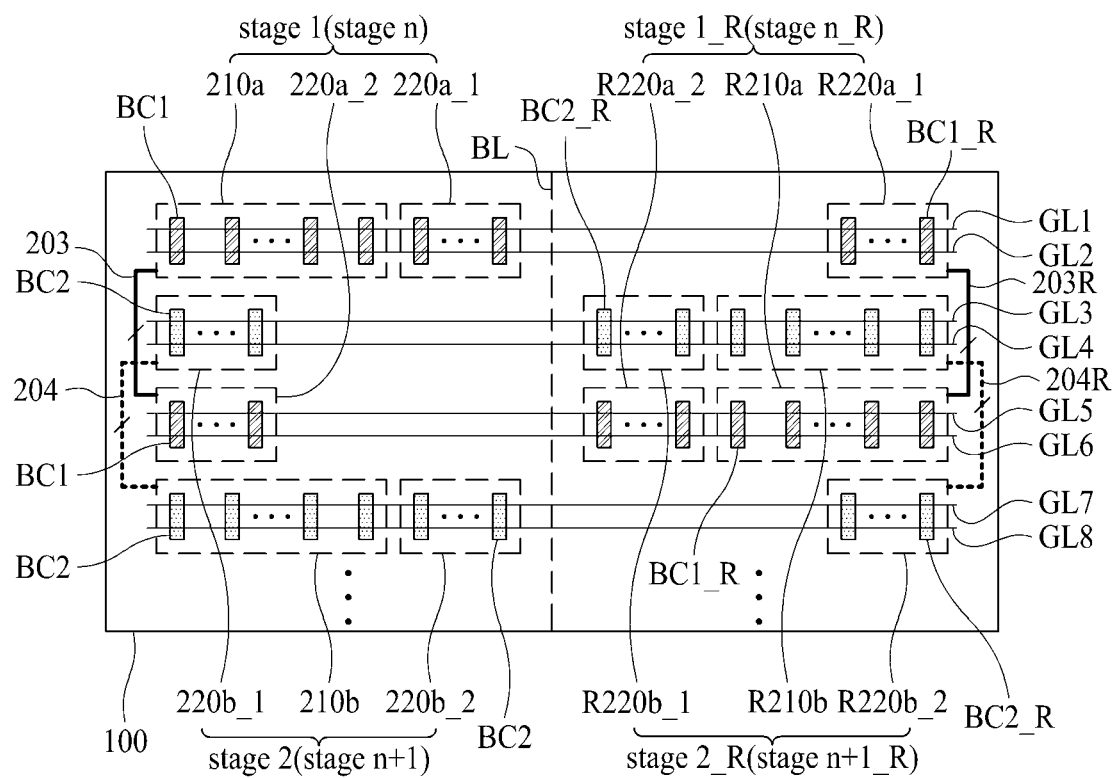
FIG. 11 is another exemplary diagram illustrating an arrangement structure of stages applied to a light emitting display apparatus according to the present disclosure.

FIG. 11 is another exemplary diagram illustrating an arrangement structure of stages applied to a light emitting display apparatus according to the present disclosure. In the following description, details which are the same or similar to details described above with reference to FIGS. 1 to 10 are omitted or will be briefly described.

When a width of a light emitting display panel increases, a length of a gate line may increase, and thus, a gate pulse transfer speed may be reduced. In this case, a size and a phase of the gate pulse may be changed based on a position of the gate line.

In order to provide such a problem, in the present disclosure, as illustrated in FIG. 11, stages may be provided in each of a left region and a right region of the light emitting display panel.

In this case, a substrate 101 configuring the light emitting display panel may be divided into a left region and a right region with respect to a boundary corresponding to a direction vertical to gate lines. That is, the substrate 101 may be divided into a left region and a right region with respect to a boundary line BL crossing a center of the substrate 101.

First, an $n^{th}$ stage Stage n and an $n+1^{th}$ stage Stage n+1 described above with reference to FIGS. 1 to 10 may be provided in the left region.

An $n^{th}$ right stage Stage n_R corresponding to the $n^{th}$ stage Stage n and an $n+1^{th}$ right stage Stage n+1_R corresponding to the $n+1^{th}$ stage Stage n+1 may be provided in the right region. The $n^{th}$ right stage Stage n_R and the $n+1^{th}$ right stage Stage n+1_R may be implemented in the same structure as the $n^{th}$ stage Stage n and the $n+1^{th}$ stage Stage n+1.

For example, as illustrated in FIG. 11, a first stage Stage1 and a second stage Stage2 may be provided in the left region, a first right stage Stage1_R and a second right stage Stage2_R corresponding to the first stage Stage1 may be provided in the right region. First right branch circuit units BC1_R may be included in the first right stage Stage1_R, and second right branch circuit units BC2_R may be included in the second right stage Stage2_R.

A $3\text{-}2^{th}$ buffer R220a_2 of two buffers configuring the $n^{th}$ right stage Stage n_R and a third shift register R210a configuring the $n^{th}$ right stage may be provided in an $n+2^{th}$ horizontal portion Hn+2, a $3\text{-}1^{th}$ buffer R220a_1 of the two buffers may be provided in an $n^{th}$ horizontal portion Hn, a $4\text{-}1^{th}$ buffer R220b_1 of two buffers configuring the $n+1^{th}$ right stage Stage n+1_R and a third shift register R210b configuring the $n+1^{th}$ right stage may be provided in an $n+1^{th}$ horizontal portion Hn+1, and a $4\text{-}2^{th}$ buffer R220b_2 of the two buffers may be provided in an $n+3^{th}$ horizontal portion Hn+3.

As described above, the number of transistors included in a first shift register 210a and a second shift register 210b may be more than the number of transistors included in a $1\text{-}1^{th}$ buffer 220a_1, a $1\text{-}2^{th}$ buffer 220a_2, a $2\text{-}1^{th}$ buffer 220b_1, and a $2\text{-}2^{th}$ buffer 220b_2.

Therefore, when two shift registers are provided in the same horizontal portion, transistors included in the two shift registers may not be provided in the horizontal portion.

Accordingly, one shift register and two buffers may be provided in one horizontal portion.

In this case, a 3-2$^{th}$ buffer R220a2 may be connected to a 4n+1$^{th}$ gate line GL4n+1 and a 4n+2$^{th}$ gate line GL4n+2, and a 3-1$^{th}$ buffer R220a_1 may be connected to a 4n-3$^{th}$ gate line GL4n-3 and a 4n-2$^{th}$ gate line GL4n-2. A 4-1$^{th}$ buffer R220b_1 may be connected to a 4n-1$^{th}$ gate line GL4n-1 and a 4n$^{th}$ gate line GL4n, and a 4-2$^{th}$ buffer R220b_2 may be connected to a 4n+3$^{th}$ gate line GL4n+3 and a 4n+4$^{th}$ gate line GL4n+4.

Therefore, the 1-1$^{th}$ buffer 220a_1 and the 3-1$^{th}$ buffer R220a_1 may output the same gate pulses, the 1-2$^{th}$ buffer 220a_2 and the 3-2$^{th}$ buffer R220a_2 may output the same gate pulses, the 2-1$^{th}$ buffer 220b_1 and the 4-1$^{th}$ buffer R220b_1 may output the same gate pulses, and the 2-2$^{th}$ buffer 220b_2 and the 4-2$^{th}$ buffer R220b_2 may output the same gate pulses.

That is, the first shift register 210a may be implemented in the same structure as a third shift register R210a, the second shift register 210b may be implemented in the same structure as a fourth shift register R210b, the 1-1$^{th}$ buffer 220a_1 and the 3-1$^{th}$ buffer R220a_1 may be implemented in the same structure, the 1-2$^{th}$ buffer 220a_2 and the 3-2$^{th}$ buffer R220a_2 may be implemented in the same structure, the 2-1$^{th}$ buffer 220b_1 and the 4-1$^{th}$ buffer R220b_1 may be implemented in the same structure, and the 2-2$^{th}$ buffer 220b_1 and the 4-2$^{th}$ buffer R220b_2 may be implemented in the same structure.

The 4n-3$^{th}$ gate line GL4n-3 and the 4n-2$^{th}$ gate line GL4n-2 included in the n$^{th}$ horizontal portion Hn and the 4n+1$^{th}$ gate line GL4n+1 and the 4n+2$^{th}$ gate line GL4n+2 included in the n+2$^{th}$ horizontal portion Hn+2 may be connected to the n$^{th}$ stage Stage n and the n$^{th}$ right stage Stage n_R. For example, in FIG. 11, a first stage Stage1 and a first right stage Stage1_R may be connected to the same gate lines.

Moreover, the 4n-1$^{th}$ gate line GL4n-1 and the 4n$^{th}$ gate line GL4n included in the n+1$^{th}$ horizontal portion Hn+1 and the 4n+3$^{th}$ gate line GL4n+3 and the 4n+4$^{th}$ gate line GL4n+4 included in the n+3$^{th}$ horizontal portion Hn+3 may be connected to the n+1$^{th}$ stage Stage n+1 and the n+1$^{th}$ right stage Stage n+1_R. For example, in FIG. 11, a second stage Stage2 and a second right stage Stage2_R may be connected to the same gate lines.

That is, the n$^{th}$ stage Stage n and the n$^{th}$ right stage Stage n_R may be connected to the same gate lines, and the n+1$^{th}$ stage Stage n+1 and the n+1$^{th}$ right stage Stage n+1_R may be connected to the same gate lines.

Finally, as illustrated in FIG. 11, three n$^{th}$ signal lines 203 connecting the 1-1$^{th}$ buffer 220a_1 to the 1-2$^{th}$ buffer 220a_2 and three n+1$^{th}$ signal lines 204 connecting the 2-1$^{th}$ buffer 220b_1 to the 2-2$^{th}$ buffer 220b_2 may be provided in the first region (for example, different signal line portions through a left end of the light emitting display panel).

In this case, as illustrated in FIG. 11, three n$^{th}$ right signal lines 203a connecting the 3-1$^{th}$ buffer R220a_1 to the 3-2$^{th}$ buffer R220a_2 and three n+1$^{th}$ right signal lines 204a connecting the 4-1$^{th}$ buffer R220b_1 to the 4-2$^{th}$ buffer R220b_2 may be provided in a second region (for example, different signal line portions through a right end of the light emitting display panel) which is opposite to the first region.

When the signal lines 203, 203a, 204, and 204a overlap the gate lines, noise may be applied to the gate lines to cause an abnormal operation of each of switching transistors Tsw1, and thus, the signal lines 203, 203a, 204, and 204a may be disposed at positions which do not overlap the gate lines.

Figure 12:
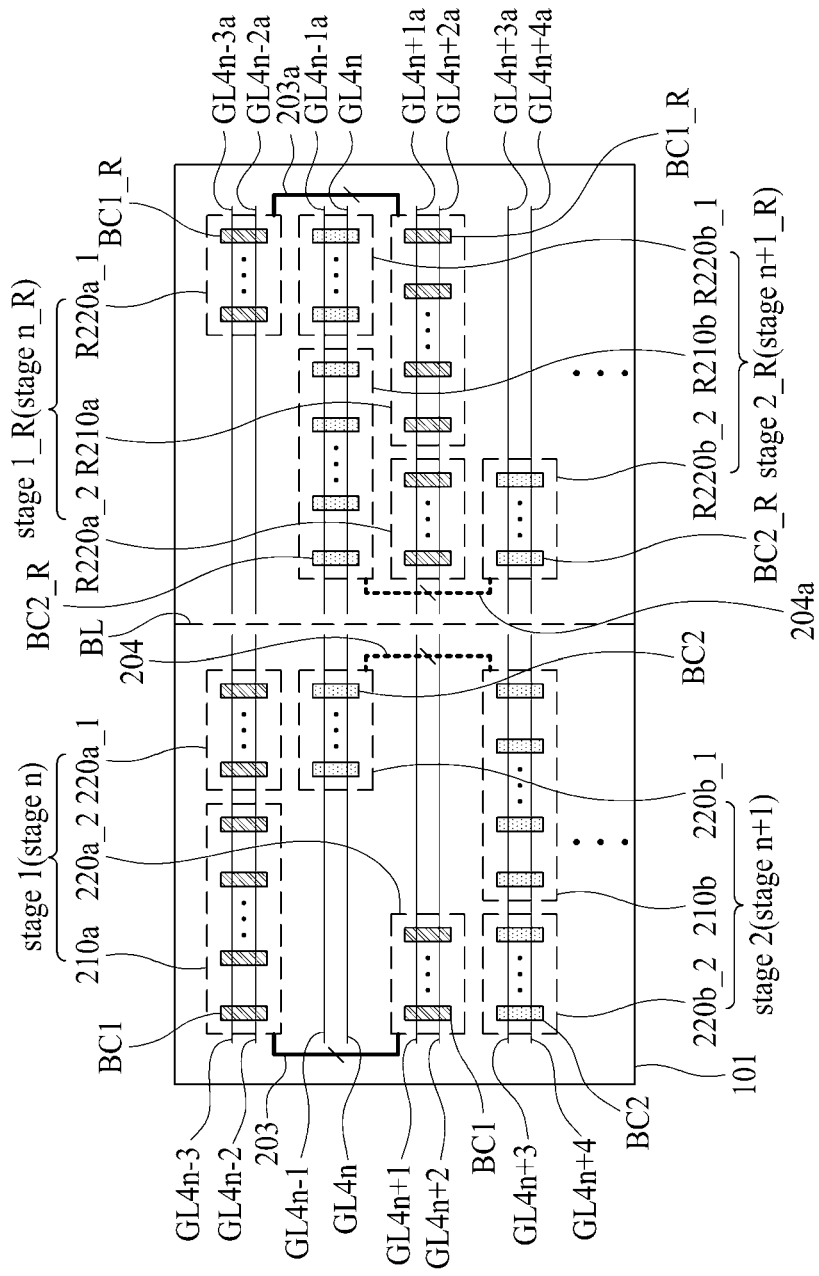
FIG. 12 is another exemplary diagram illustrating an arrangement structure of stages applied to a light emitting display apparatus according to the present disclosure.

FIG. 12 is another exemplary diagram illustrating an arrangement structure of stages applied to a light emitting display apparatus according to the present disclosure. Except for that gate lines are apart from one another with respect to a boundary line BL, the light emitting display panel illustrated in FIG. 12 may have the same structure as that the light emitting display panel illustrated in FIG. 11. Hereinafter, therefore, only features of FIG. 12 which differ from those of FIG. 11 will be described.

First, 4n-3$^{th}$ to 4n+4$^{th}$ right gate lines GL4n-3a to GL4n+4a corresponding to 4n-3$^{th}$ to 4n+4$^{th}$ gate lines GL4n-3 to GL4n+4 provided in a left region of a substrate may be provided in a right region of the substrate.

In this case, the 4n-3$^{th}$ to 4n+4$^{th}$ gate lines GL4n-3 to GL4n+4 may be apart from the 4n-3$^{th}$ to 4n+4$^{th}$ right gate lines GL4n-3a to GL4n+4a.

The 4n-3$^{th}$ gate line GL4n-3, the 4n-2$^{th}$ gate line GL4n-2, the 4n+1$^{th}$ gate line GL4n+1, and the 4n+2$^{th}$ gate line GL4n+2 may be connected to an n$^{th}$ stage Stage n, and the 4n-3$^{th}$ right gate line GL4n-3a, the 4n-2$^{th}$ right gate line GL4n-2a, the 4n+1$^{th}$ right gate line GL4n+1a, and the 4n+2$^{th}$ right gate line GL4n+2a may be connected to an n$^{th}$ right stage Stage n_R.

The 4n-1$^{th}$ gate line GL4n-1, the 4n$^{th}$ gate line GL4n, the 4n+3$^{th}$ gate line GL4n+3, and the 4n+4$^{th}$ gate line GL4n+4 may be connected to an n+1$^{th}$ stage Stage n+1, and the 4n-1$^{th}$ right gate line GL4n-1a, the 4n$^{th}$ right gate line GL4na, the 4n+3$^{th}$ right gate line GL4n+3a, and the 4n+4$^{th}$ right gate line GL4n+4a may be connected to an n+1$^{th}$ right stage Stage n+1_R.

Finally, as illustrated in FIG. 12, three n$^{th}$ signal lines 203 connecting the 1-1$^{th}$ buffer 220a_1 to the 1-2$^{th}$ buffer 220a_2 may be provided in a first region (for example, different signal line portions through a left end of the light emitting display panel), and three n+1$^{th}$ signal lines 204 connecting the 2-1$^{th}$ buffer 220b_1 to the 2-2$^{th}$ buffer 220b_2 may be provided in a third region (for example, different signal line portions through a region adjacent to a left side of a boundary line BL) which is opposite to the first region.

That is, in the light emitting display panel illustrated in FIG. 12, because gate lines are apart from one another with respect to the boundary line BL, even when the n+1$^{th}$ signal lines 204 are arranged adjacent to the boundary line BL, the n+1$^{th}$ signal lines 204 may not overlap the gate lines. Accordingly, a problem caused by an overlap of the n+1$^{th}$ signal lines 204 and the gate lines may not occur.

In this case, as illustrated in FIG. 12, three n$^{th}$ right signal lines 203a connecting the 3-1$^{th}$ buffer R220a_1 to the 3-2$^{th}$ buffer R220a_2 may be provided in a second region (for example, different signal line portions through a right end of the light emitting display panel) which is opposite to the first region, and three n+1$^{th}$ right signal lines 204a connecting the 4-1$^{th}$ buffer R220b_1 to the 4-2$^{th}$ buffer R220b_2 may be provided in a fourth region (for example, different signal line portions through a region adjacent to a right side of the boundary line BL) which is opposite to the second region.

However, the n$^{th}$ signal line 203 and the n$^{th}$ right signal line 203a may be provided at a left side and a right side of the boundary line BL, and the n+1$^{th}$ signal line 204 and the n+1$^{th}$ right signal line 204a may be provided at a left side and a right side of the light emitting display panel.

Figure 13:
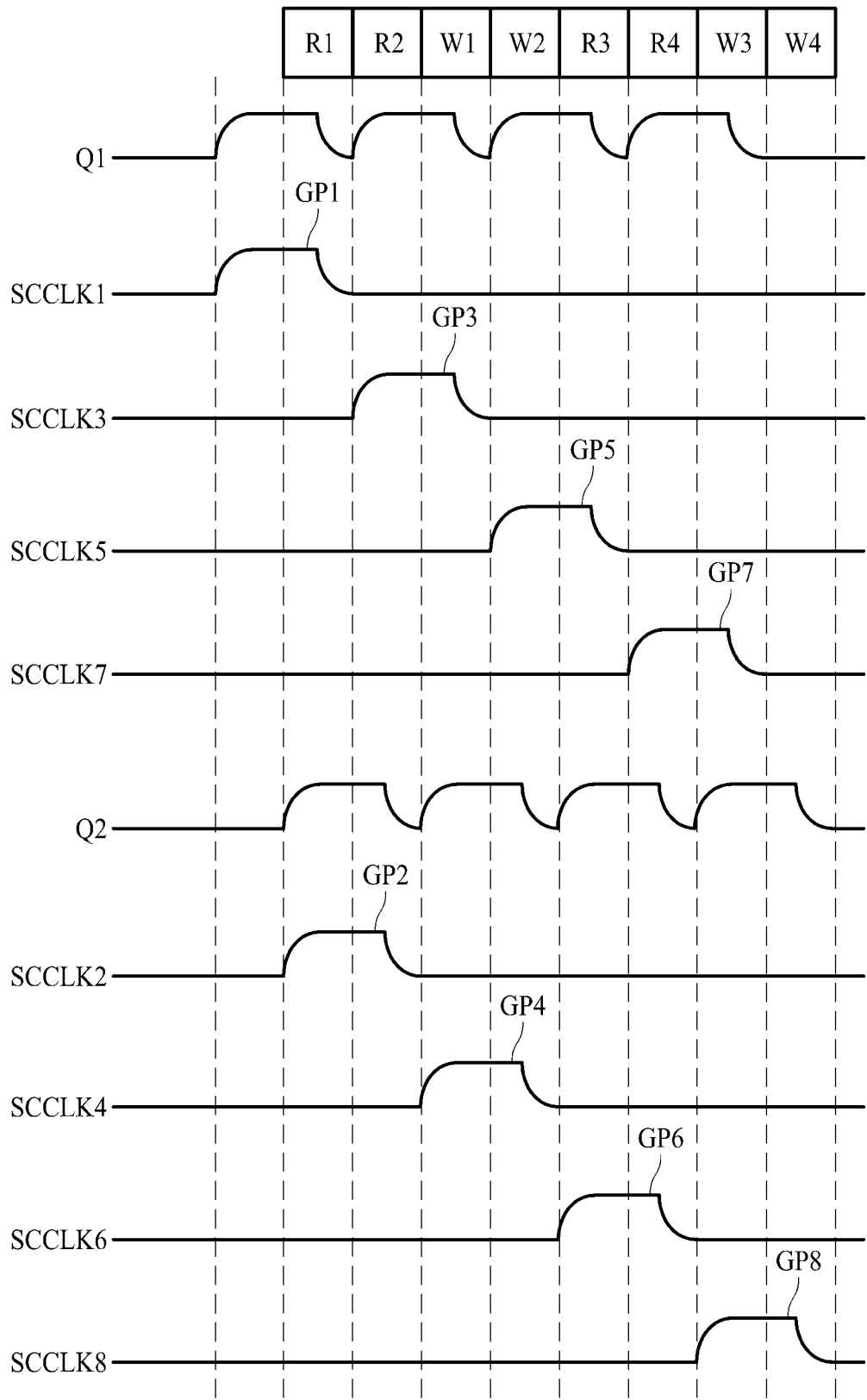
FIG. 13 is a waveform diagram for describing a driving method of stages illustrated in FIG. 5.
Figure 14:
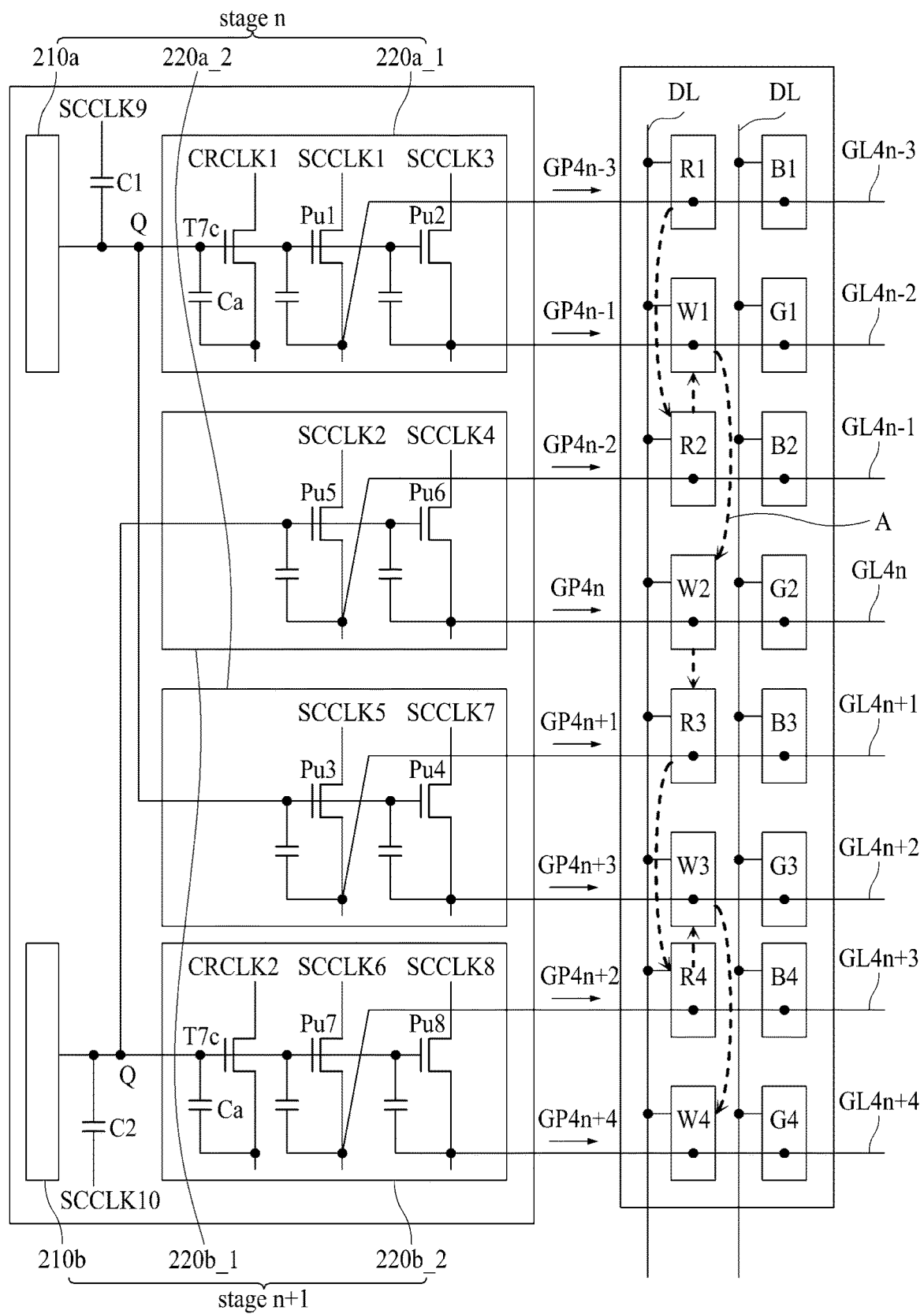
FIG. 14 is an exemplary diagram illustrating a structure of each of the first signal output unit and the second signal output unit illustrated in FIG. 4.
Figure 15:
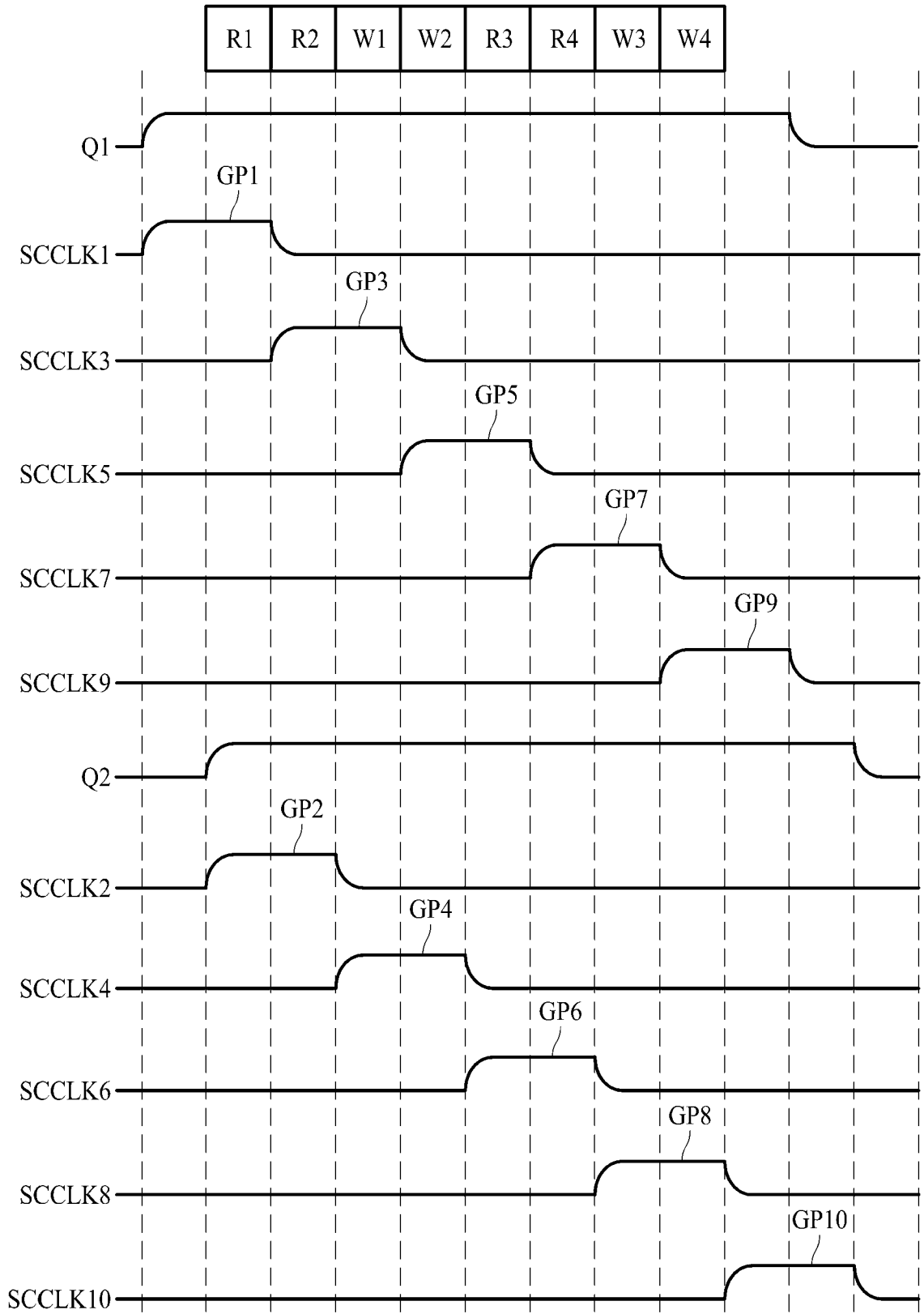
FIG. 15 is a waveform diagram for describing a driving method of stages illustrated in FIG. 14.

FIG. 13 is a waveform diagram for describing a driving method of stages illustrated in FIG. 5, FIG. 14 is an exemplary diagram illustrating a structure of each of the first signal output unit and the second signal output unit illustrated in FIG. 4, and FIG. 15 is a waveform diagram for describing a driving method of stages illustrated in FIG. 14.

As described above, a gate pulse may be sequentially output to a 4n-3$^{th}$ gate line, a 4n-1$^{th}$ gate line, a 4n-2$^{th}$ gate line, a 4n$^{th}$ gate line, a 4n+1$^{th}$ gate line, a 4n+3$^{th}$ gate line, a 4n+2$^{th}$ gate line, and a 4n+4$^{th}$ gate line, and such an output form may be expressed as a zigzag form. Gate pulses GP1 to GP8 may be generated based on gate clocks SCCLK1 to SCCLK8 described below. That is, first to eighth gate clocks SCCLK1 to SCCLK8 supplied to a 1-1$^{th}$ buffer, a 1-2$^{th}$ buffer, and a 2-2$^{th}$ buffer may be first to eighth gate pulses GP1 to GP8.

To this end, as illustrated in FIGS. 5 and 13, the first gate clock SCCLK1 and the third gate clock SCCLK3 may be supplied to a 1-1$^{th}$ buffer 220a_1, the fifth gate clock SCCLK5 and the seventh gate clock SCCLK7 may be supplied to a 1-2$^{th}$ buffer 220a_2, the second gate clock SCCLK2 and the fourth gate clock SCCLK4 may be supplied to a 2-1$^{th}$ buffer 220b_1, and the sixth gate clock SCCLK6 and the eighth gate clock SCCLK8 may be supplied to a 2-2$^{th}$ buffer 220b_2.

In this case, a first Q node signal Q1 applied to a Q node Q of an n$^{th}$ stage Stage n may fall together with falling of the first gate clock SCCLK1, the third gate clock SCCLK3, the fifth gate clock SCCLK5, and the seventh gate clock SCCLK7 and may rise together with rising of the first gate clock SCCLK1, the third gate clock SCCLK3, the fifth gate clock SCCLK5, and the seventh gate clock SCCLK7.

Moreover, a second Q node signal Q2 applied to a Q node Q of an n+1$^{th}$ stage Stage n+1 may fall together with falling of the second gate clock SCCLK2, the fourth gate clock SCCLK4, the sixth gate clock SCCLK6, and the eighth gate clock SCCLK8 and may rise together with rising of the second gate clock SCCLK2, the fourth gate clock SCCLK4, the sixth gate clock SCCLK6, and the eighth gate clock SCCLK8.

That is, as illustrated in FIG. 13, when gate clocks do not overlap, a condition when all of the gate clocks are rising may be the same as a condition when all of the gate clocks are falling.

Accordingly, waveforms of all gate pulses generated based on the gate clocks may be maintained in the same form.

However, because gate pulses should be supplied to more gate lines at the same time as a resolution of a light emitting display apparatus increases, an interval between gate clocks may be reduced.

Therefore, gate clocks may overlap.

In this case, because an influence of falling of a first gate clock is offset by an influence of rising of a third gate clock and an influence of falling of the third gate clock is offset by an influence of rising of a fifth gate clock, the first Q node signal Q1 applied to the Q node Q of the n$^{th}$ stage Stage n may be maintained at the same level while the first gate clock, the third gate clock, and the fifth gate clock are being supplied. Accordingly, the first gate clock, the third gate clock, and the fifth gate clock may be output in the same form.

However, because there is no signal which rises at a timing at which a seventh gate clock is falling, the first Q node signal Q1 may fall. Therefore, a condition of when a seventh gate pulse is output by the seventh gate clock may differ from a condition of when a first gate pulse, a second gate pulse, and a fifth gate pulse are output based on the first gate clock, the third gate clock, and the fifth gate clock.

Accordingly, a waveform of the seventh gate pulse based on the seventh gate clock may differ from waveforms of the first gate pulse, the second gate pulse, and the fifth gate pulse.

A phenomenon described above may also occur in the second Q node signal Q2 applied to the Q node Q of the n+1$^{th}$ stage Stage n+1. Therefore, a waveform of an eighth gate pulse based on an eighth gate clock may differ from waveforms of a second gate pulse, a fourth gate pulse, and a sixth gate pulse based on a second gate clock, a fourth gate clock, and a sixth gate clock.

In order to prevent such a problem, as illustrated in FIG. 14, a first stabilization capacitor C1 may be connected to the Q node Q of the n$^{th}$ stage Stage n, and a second stabilization capacitor C2 may be connected to the Q node Q of the n+1$^{th}$ stage Stage n+1.

In this case, a ninth gate clock SCCLK9 may be supplied to the first stabilization capacitor C1, and a tenth gate clock SCCLK10 may be supplied to the second stabilization capacitor C2.

For example, the ninth gate clock SCCLK9 may rise when the seventh gate clock SCCLK7 is falling, and the tenth gate clock SCCLK10 may rise when the eighth gate clock SCCLK8 is falling.

Therefore, because an influence of falling of the seventh gate clock SCCLK7 is offset by an influence of rising of the ninth gate clock SCCLK9, a level of the first Q node signal Q1 when the seventh gate clock SCCLK7 is falling may be the same as a level of the first Q node signal Q1 when the first gate clock SCCLK1, the third gate clock SCCLK3, and the fifth gate clock SCCLK5 are falling.

Therefore, a waveform of a seventh gate pulse GP7 based on the seventh gate clock SCCLK7 may be the same as waveforms of a first gate pulse GP1, a third gate pulse GP3, and a fifth gate pulse GP5 based on the first gate clock SCCLK1, the third gate clock SCCLK3, and the fifth gate clock SCCLK5.

Moreover, because an influence of falling of the eighth gate clock SCCLK8 is offset by an influence of rising of the tenth gate clock SCCLK10, a level of the second Q node signal Q2 when the eighth gate clock SCCLK8 is falling may be the same as a level of the second Q node signal Q2 when the second gate clock SCCLK2, the fourth gate clock SCCLK4, and the sixth gate clock SCCLK6 are falling.

Therefore, a waveform of an eighth gate pulse GP8 based on the eighth gate clock SCCLK8 may be the same as waveforms of a second gate pulse GP2, a fourth gate pulse GP4, and a sixth gate pulse GP6 based on the second gate clock SCCLK2, the fourth gate clock SCCLK4, and the sixth gate clock SCCLK6.

Therefore, gate pulses having the same form may be output to all gate lines.

Accordingly, the quality of a light emitting display apparatus may be enhanced.

According to the present disclosure, the number of transistors included in one stage and the number of signal lines connected to one stage may decrease compared to a light emitting display panel of the related art.

Accordingly, even when a resolution of the light emitting display panel increases, signal lines connected to stages may all be included in a display area.

Moreover, according to the present disclosure, because four gate pulses are output from one stage, the number of stages may be reduced, and thus, a region where the stages are provided may be reduced compared to the light emitting display panel of the related art.

Moreover, according to the present disclosure, data toggling may decrease by ½. When data toggling is reduced, a problem where heat occurs in an IC configuring a data driver may be solved. Accordingly, the quality of the display apparatus according to the present disclosure may be enhanced.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus comprising:
a substrate;
a gate driver provided on the substrate;
a plurality of stages within the gate driver and
a plurality of gate lines electrically connected to the stages,
wherein each of the stages includes a shift register and two buffers connected to the shift register,
a first buffer of two buffers and a first shift register configuring a first stage are provided in an $n^{th}$ horizontal portion and in which n is an odd number,
a second buffer of the two buffers configuring the first stage is provided in a third horizontal portion,
a third buffer of two buffers and a second shift register configuring a second stage are provided in a fourth horizontal portion;
a fourth buffer of the two buffers configuring the second stage is provided in a second horizontal portion,
the first horizontal portion is a region including pixels which are arranged along a first gate line and a second gate line,
the second horizontal portion is a region including pixels which are arranged along a third gate line and a fourth gate line,
the third horizontal portion is a region including pixels which are arranged along a fifth gate line and a sixth gate line, and
the fourth horizontal portion is a region including pixels which are arranged along a seventh gate line and an eighth gate line.

2. The light emitting display apparatus of claim 1, wherein the first buffer is connected to the first gate line and the second gate line, and the second buffer is connected to the fifth gate line and the sixth gate line.

3. The light emitting display apparatus of claim 1, wherein the third buffer is connected to the seventh gate line and the eighth gate line, and the fourth buffer is connected to the third gate line and the fourth gate line.

4. The light emitting display apparatus of claim 1, wherein at least one $n^{th}$ signal line is connected to the first buffer and the first shift register and three $n+1^{th}$ signal lines are connected to the fourth buffer and are provided in an $n^{th}$ signal line portion between the first horizontal portion and the second horizontal portion,
three $n^{th}$ signal lines of the at least one $n^{th}$ signal lines extend to an $n+2^{th}$ signal line portion between the third horizontal portion and the fourth horizontal portion,
the three $n+1^{th}$ signal lines extend to the $n+2^{th}$ signal line portion, and
at least one $n+1^{th}$ signal line connected to the third buffer and the second shift register is further provided in the $n+2^{th}$ signal line portion.

5. The light emitting display apparatus of claim 4, wherein the three $n^{th}$ signal lines provided in the $n+2^{th}$ signal line portion are connected to the second buffer, and
the three $n+1^{th}$ signal lines provided in the $n+2^{th}$ signal line portion are connected to the third buffer and the second shift register.

6. The light emitting display apparatus of claim 4, wherein one-side ends of the three $n^{th}$ signal lines provided in the $n^{th}$ signal line portion and one-side ends of the three $n+1^{th}$ signal lines provided in the $n^{th}$ signal line portion extend to the $n+2^{th}$ signal line portion through the same region.

7. The light emitting display apparatus of claim 4, wherein one-side ends of the three $n^{th}$ signal lines provided in the $n^{th}$ signal line portion extend to the $n+2^{th}$ signal line portion through a first region where one-side ends of gate lines included in the second horizontal portion and the third horizontal portion are provided, and
one-side ends of the three $n+1^{th}$ signal lines provided in the $n^{th}$ signal line portion extend to the $n+2^{th}$ signal line portion through the first region.

8. The light emitting display apparatus of claim 4, wherein one-side ends of the three $n^{th}$ signal lines provided in the $n^{th}$ signal line portion and one-side ends of the three $n+1^{th}$ signal lines provided in the $n^{th}$ signal line portion extend to the $n+2^{th}$ signal line portion through different regions.

9. The light emitting display apparatus of claim 4, wherein one-side ends of the three $n^{th}$ signal lines provided in the $n^{th}$ signal line portion extend to the $n+2^{th}$ signal line portion through a first region where one-side ends of gate lines included in the second horizontal portion and the third horizontal portion are provided, and
one-side ends of the three $n+1^{th}$ signal lines provided in the $n^{th}$ signal line portion extend to the $n+2^{th}$ signal line portion through a second region where other-side ends of gate lines included in the second horizontal portion and the third horizontal portion are provided.

10. The light emitting display apparatus of claim 1, wherein the substrate is divided into a left region and a right region with respect to a boundary corresponding to a direction vertical to the gate lines,
   the first stage and the second stage are provided in the left region, and
   an first right stage corresponding to the first stage and an second right stage corresponding to the second stage are provided in the right region.

11. The light emitting display apparatus of claim 10, wherein a fifth buffer of two buffers and a third shift register configuring an first right stage are provided in the third horizontal portion and a sixth buffer of the two buffers is provided in the first horizontal portion, and
   a seventh buffer of two buffers and a third shift register configuring an second right stage are provided in an second horizontal portion and an eighth buffer of the two buffers is provided in an fourth horizontal portion.

12. The light emitting display apparatus of claim 11, wherein the fifth buffer is connected to the fifth gate line and the sixth gate line, and the sixth buffer is connected to the first gate line and the second gate line.

13. The light emitting display apparatus of claim 11, wherein the seventh buffer is connected to the third gate line and the fourth gate line, and the eighth buffer is connected to the seventh gate line and the eighth gate line.

14. The light emitting display apparatus of claim 10, wherein the first stage and the first right stage are connected to the same gate lines, and
   the second stage and the second right stage are connected to the same gate lines.

15. The light emitting display apparatus of claim 10, wherein the first gate line and the second gate line included in the first horizontal portion and the fifth gate line and the sixth gate line included in the third horizontal portion are connected to the first stage and the first right stage, and
   the third gate line and the fourth gate line included in the second horizontal portion and the seventh gate line and the eighth gate line included in the fourth horizontal portion are connected to the second stage and the second right stage.

16. The light emitting display apparatus of claim 10, wherein first to eighth right gate lines corresponding to first to eighth gate lines provided in the left region of the substrate are provided in the right region of the substrate, and
   the first to eighth gate lines are apart from the first to eighth right gate lines with respect to the boundary.

17. The light emitting display apparatus of claim 16, wherein the first gate line, the second gate line, the fifth gate line, and the sixth gate line are connected to the first stage,
   the first right gate line, the second right gate line, the fifth right gate line, and the sixth right gate line are connected to the first right stage,
   the third gate line, the fourth gate line, the seventh gate line, and the eighth gate line are connected to the second stage, and
   the third right gate line, the fourth right gate line, the seventh right gate line, and the eighth right gate line are connected to the second right stage.

18. The light emitting display apparatus of claim 1, wherein a gate pulse is sequentially output to the first gate line, the third gate line, the second gate line, the fourth gate line, the fifth gate line, the seventh gate line, the sixth gate line, and the eighth gate line.

19. The light emitting display apparatus of claim 18, wherein the first stage is connected to the first gate line, the second gate line, the fifth gate line, and the sixth gate line, and
   the second stage is connected to the third gate line, the fourth gate line, the seventh gate line, and the eighth gate line.

20. A light emitting display apparatus comprising:
   a substrate;
   a gate driver provided on the substrate;
   a plurality of stages within the gate driver and
   a plurality of gate lines electrically connected to the stages,
   wherein each of the stages includes a shift register and two buffers connected to the shift register,
   a first horizontal position on the substrate includes a first stage of plurality of stages and first, second, third and fourth gate lines;
   a second horizontal position on the substrate includes a second stage and fifth, sixth, seventh and eighth gate lines;
   a first buffer in the first stage drives the first and second gate lines and a second buffer in the first stage drives the fifth and sixth gate lines;
   a first buffer in the second stage drives the third and fourth gate lines and second buffer in the second stage drives the seventh and eighth gate lines.

21. The light emitting display apparatus of claim 20 wherein the sequence of gate pulses being output to drive the respective gate lines is as follows:
   a first gate pulse output from the first stage onto the first gate line; and
   a second gate pulse output from the second stage onto the third gate line.

22. The light emitting display apparatus of claim 21 wherein the sequence of gate pulses being output to drive the respective gate lines further includes:
   a third gate pulse output from the first stage onto the second gate line; and
   a fourth gate pulse output from the second stage onto the fourth gate line.

23. The light emitting display apparatus of claim 20 wherein the gate pluses to drive the respective gate lines are output in a time sequence that alternates from being output between the first and second stages.

* * * * *